(12) United States Patent  
Kang et al.

(10) Patent No.: US 8,605,496 B2
(45) Date of Patent: Dec. 10, 2013

(54) SEMICONDUCTOR MEMORY DEVICE FOR WRITING DATA TO MULTIPLE CELLS SIMULTANEOUSLY AND REFRESH METHOD THEREOF

(75) Inventors: Hee Bok Kang, Cheongju-si (KR); Suk Kyoung Hong, Gwacheon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 10 days.

(21) Appl. No.: 13/152,692

(22) Filed: Jun. 3, 2011

(65) Prior Publication Data

US 2011/0235409 A1   Sep. 29, 2011

Related U.S. Application Data

(62) Division of application No. 12/204,965, filed on Sep. 5, 2008, now Pat. No. 7,961,534.

(30) Foreign Application Priority Data

Sep. 10, 2007   (KR) .......................... 10-2007-0091732
Sep. 21, 2007   (KR) .......................... 10-2007-0096991

(51) Int. Cl.
   *G11C 11/00*   (2006.01)
(52) U.S. Cl.
   USPC ...... 365/163; 365/189.05; 365/196; 365/148; 365/158

(58) Field of Classification Search
   USPC .................... 365/163, 189.05, 196, 148, 158
   See application file for complete search history.

(56) References Cited

U.S. PATENT DOCUMENTS

| | | | |
|---|---|---|---|
| 6,622,197 B1 * | 9/2003 | Kim .............................. 711/100 |
| 7,257,034 B2 * | 8/2007 | Takemura et al. ........ 365/189.05 |
| 7,599,208 B2 * | 10/2009 | Kang ............................ 365/145 |
| 7,664,903 B2 * | 2/2010 | Belonoznik ................... 710/315 |
| 7,869,257 B2 * | 1/2011 | Philipp et al. ................. 365/148 |
| 7,989,789 B2 * | 8/2011 | Toda ................................ 257/2 |
| 8,089,800 B2 * | 1/2012 | Porter ........................... 365/148 |
| 8,355,291 B2 * | 1/2013 | Kim et al. ..................... 365/222 |
| 2006/0158948 A1 * | 7/2006 | Fuji .............................. 365/222 |
| 2007/0091673 A1 | 4/2007 | Asao et al. |

FOREIGN PATENT DOCUMENTS

KR   1020030078888   10/2003

* cited by examiner

*Primary Examiner* — Connie Yoha
(74) *Attorney, Agent, or Firm* — IP & T Group LLP

(57) ABSTRACT

A semiconductor memory device includes a read/write bit line configured to supply a cell driving voltage. A selecting unit is connected to the read/write bit line and is controlled by a word line. A plurality of cells are connected between the selecting unit and a source line, and the cells are configured to read and write data according to a cell driving voltage. Each switching element of a plurality of switching elements are connected in parallel with a single cell of the plurality of cells, and the plurality of switching elements are controlled selectively by a plurality of bit lines.

10 Claims, 48 Drawing Sheets

SEMICONDUCTOR MEMORY DEVICE FOR WRITING DATA TO MULTIPLE CELLS SIMULTANEOUSLY AND REFRESH METHOD THEREOF

CROSS-REFERENCES TO RELATED APPLICATIONS

This application is a division of U.S. patent application Ser. No. 12/204,965 filed on Sep. 5, 2008 now U.S. Pat. No. 7,961,534, which claims priority to Korean Patent Application Nos. 10-2007-0091732 and 10-2007-0096991 filed on Sep. 10, 2007 and on Sep. 21, 2007. The disclosure of each of the foregoing applications is incorporated herein by reference in its entirety.

BACKGROUND OF THE INVENTION

The present invention relates generally to a semiconductor memory device and a refresh method thereof, and more particularly, to a semiconductor memory device configured to write data simultaneously in a plurality of cells without increasing a write current.

Recently, the demand for semiconductor devices has increased due to the rapid distribution of computers. These semiconductor devices are required to operate at high-speed with high accumulating capacity. As a result, various manufacturing techniques have been developed to improve the integration, response speed, and reliability of the semiconductor devices.

Dynamic Random Access Memory (DRAM), configured to input and output information freely at high capacity, has been widely used in semiconductor devices. The DRAM includes a memory cell region, for storing information data with a charge type, and a peripheral region, for inputting and outputting the information data. The DRAM also includes an access transistor and an accumulating capacitor.

The DRAM must have a continuous power supply in order to store data as a volatile memory. Instant disconnection of the power may destroy the data of a RAM because a memory cell of the DRAM is designed based on small charging electrons for maintaining the charged power. These charging electrons are analogous to a tiny battery that is not continuously recharged, and which may therefore lose even the previously charged power.

A refresh operation refers to a recharging process of a memory cell in a memory chip. Memory cells in a row may be charged in each refresh cycle. Although the refresh operation is performed by the system's memory control, some chips are designed to perform a self-refresh operation.

For example, a DRAM chip having a self-refresh circuit configured to perform a self-refresh operation without a Central Processing Unit (CPU) or an external refresh circuit has been disclosed. The self-refresh method has been frequently used in portable computers to reduce power consumption.

FIG. 1 is a diagram showing a cell array of a conventional DRAM.

The conventional DRAM comprises a plurality of bit lines BL arranged in a column direction and a plurality of word lines WL arranged in a row direction. A plurality of unit cells are positioned at the intersections of the word lines WL and the bit lines BL.

Each unit cell performs a switching operation depending on the state of the word line WL, and includes one switching element T, for connecting a capacitor C to the bit line BL, and one capacitor C, connected between a plate line PL and a terminal of the switching element T. The switching element T includes an NMOS transistor, and the switching operation of the switching element T is controlled by a gate control signal.

A sense amplifier S/A, connected to the bit line BL, senses and amplifies cell data applied from the bit line BL. The sense amplifier S/A is shared by two bit lines BL.

The DRAM stores charges in the capacitor C and senses a change in the voltage applied to the sense amplifier through the bit line BL to distinguish a logic data "1" from a logic data "0". The capacitor C requires capacitance of a few fF because the DRAM is required to read fine changes in voltage of the bit line BL.

However, the conventional DRAM must frequently perform the refresh operation because it is volatile and has a short refresh cycle. That is, in the conventional DRAM, charges stored in the capacitor C leak over time. As a result, the DRAM cyclically performs a refresh operation for reading and writing data (for example, every 64 msec), which causes large power consumption and degradation of operational performance.

Generally, a nonvolatile memory, such as a magnetic memory and a phase change memory (PCM), has a data processing speed similar to that of a volatile Random Access Memory (RAM), and can conserve data even after the power is turned off.

FIGS. 2a and 2b are diagrams showing a conventional phase change resistor (PCR) 4.

The PCR 4 comprises a phase change material (PCM) 2 inserted between an upper electrode 1 and a lower electrode 3. Application of a voltage and a current to the PCR 4 causes such an increase in temperature in the PCM 2 that the electrically conductive state of the PCR 4 is changed depending on resistance.

The PCM 2 comprises AgLnSbTe. The PCM 2 may also is comprise chalcogenide having chalcogen elements (S, Se, Te) as a main ingredient, specifically a germanium antimonic tellurium (Ge2Sb2Te5) consisting of Ge—Sb—Te.

FIGS. 3a and 3b are diagrams illustrating operation of the conventional phase change resistor shown in FIGS. 2a and 2b.

As shown in FIG. 3a, the PCM 2 may be crystallized when a low current, i.e., a current less than the threshold value, flows through the PCR 4. As a result, the PCM 2 becomes a crystallized low resistance material.

As shown in FIG. 3b, the PCM 2 can be amorphized when a high current, i.e., a current higher than a threshold value, flows through the PCR 4. That is, the temperature of the PCM 2 is increased higher that its melting point when a high current flows through the PCR 4. As a result, the PCM 2 becomes an amorphous high resistance material.

In this way, the PCR 4 is configured to store nonvolatile data corresponding to the two resistance states. A logic data "1" refers to the PCR 4 having a low resistance state, and a logic data "0" to refers to the PCR 4 having a high resistance state, such that the logic states of the two data can be stored.

FIG. 4 is a diagram illustrating the write operation of a conventional phase change resistance cell.

Heat is generated when a current flows through the upper electrode 1 and the lower electrode 3 of the PCR 4 for a given time. As a result, a state of the PCM 2 is changed to be either crystalline or amorphous depending on temperature given to the upper electrode 1 and the lower electrode 3.

When a low current flows for a given time, the PCM 2 becomes crystalline and the PCR 4, having a low resistance, is at a set state. On the other hand, when a high current flows for a given time, the PCM 2 becomes amorphous and the PCR 4, having a high resistance, is at a reset state. The difference between the two phases corresponds to a change in the electric resistance.

As a result, a low voltage must be applied to the PCR 4 for a longer period of time in order to write the set state in a write mode. On the other hand, a high voltage is applied to the PCR 4 for a shorter period of time in order to write the reset state in the write mode.

However, a phase change memory device using the PCR 4 has a large write current for writing data in a cell. As such, the number of cells to which date can be written simultaneously is limited resulting in degraded write performance.

Although the conventional phase change memory device has a nonvolatile characteristic, cell data is subject to increasing degradation over time, thereby limiting data retention time.

When current of the bit line BL corresponding to the logic data "1" and "0" is decreased, the data retention characteristic is degraded, resulting in difficulties in retaining the optimum nonvolatile cell storing characteristic for a long period of time.

A magnetoresistive random access memory (MRAM) is a memory device that utilizes multi-layer ferromagnetic thin films. The MRAM reads and writes data by sensing current variations according to the magnetization direction of the respective thin films.

That is, the MRAM as a memory type for storing a magnetic polarization state in a magnetic material thin film changes or senses the magnetic polarization state by a magnetic field generated by combination of a bit line current and a word line current so as to read and write data. The MRAM has a high speed and low power consumption. The unique properties of the MRAM's magnetic thin film allow for high integration density. The MRAM also performs nonvolatile memory operations, such as a flash memory.

Generally, the MRAM includes various kinds of cells such as Giant Magneto Resistance (GMR) cells and Magnetic Tunnel Junction (MTJ) cells. The MRAM embodies a memory device by using the GMR or spin-polarized magneto-transmission (SPMT) phenomenon generated when the spin influences electron transmission.

In implementing a GMR magnetic memory device, the MRAM, using the GMR phenomenon, utilizes the fact that resistance remarkably varies when spin directions differ in two magnetic layers having a non-magnetic layer there between. In implementing a magnetic permeable junction memory device, the MRAM using the SPMT phenomenon utilizes the fact that larger current transmission is generated when spin directions are identical in two magnetic layers having an insulating layer there between.

FIGS. 5a and 5b are diagrams illustrating the cell array of a conventional MRAM. FIGS. 5a and 5b show a MRAM configured to read/write data using a spin transfer torque system.

A conventional MTJ cell has a deposition structure including a fixed magnetic layer 5, a tunnel junction layer 6, and a free magnetic layer 7. The free magnetic layer 7 and the fixed magnetic layer 5 are made of a material such as NiFeCo/CoFe, and the tunnel junction layer 6 is made of a material such as $Al_2O_3$.

The free magnetic layer 7 has a different thickness from that of the fixed magnetic layer 5. The fixed magnetic layer 5 has a magnetic polarization state which is changed in a strong magnetic field, and the free magnetic layer 7 has a magnetic polarization state changed in a week magnetic field.

A transistor T connected between the MTJ cell and a source line SL is controlled by a word line WL. The bit line BL is connected to the free magnetic layer 7 of the MTJ cell, and the fixed magnetic layer 5 is connected to the drain of the cell switching transistor T. The source line SL is connected to the source of the cell switching transistor T.

A voltage generator 8 is connected to both the bit line BL and the source line SL and supplies a bipolar write pulse and a read bias for applying write/read voltages. A sense amplifier SA senses and amplifies the voltage of the bit line BL based on the reference voltage received from a reference voltage generating unit 9.

FIGS. 6a and 6b are graphs illustrating current and resistance fluctuation curves based on voltage of the conventional MRAM.

When a high voltage is applied to the source line SL and a low voltage is applied to the bit line BL, a logic data "1" having a high resistive state is written in the MTJ cell. When a low voltage is applied to the source line SL and a high voltage is applied to the bit line BL, a logic data "0" having a low resistive state is written in the MTJ cell.

However, the MRAM using a MTJ cell requires a large write current for writing data in the cell. As a result, the number of cells to which data can be written simultaneously is limited resulting in degraded write performance.

A resistive random access memory (ReRAM) device is a nonvolatile memory device which applies external voltage to thin films to change the electric resistance of a material, thereby using the resistance difference to denote a binary on/off.

FIG. 7 are diagrams showing a resistive switch device (RSD) of a conventional ReRAM.

The RSD includes a resistance switch 11 disposed between an upper electrode 10 and a lower electrode 12. The upper electrode is 10 and the lower electrode 12 include a metal material, such as platinum (Pt), and the resistance switch 11 includes a resistance insulating layer, such as TiOx.

Studies have focused on the ReRAM since the 1960s. Generally, the ReRAM includes a metal-insulator-metal (MIM) structure using a metal oxide. As a result, if a proper electrical signal is applied, the memory characteristic of the ReRAM changes from a state in which the resistance increases and the material is not conductive (off state) to a state in which the resistance decreases and the material is conductive (on state).

The ReRAM includes a current controlled negative differential resistance or a voltage controlled negative differential resistance depending on the electrical method for embodying on/off characteristics.

Materials that display a ReRAM characteristic are categorized as follows: materials such as colossal magneto-resistance (CMR) and $Pr_{1-x}CaMnO_3$ (PCMO), which are inserted between electrodes to use resistance change by an electric field; binary oxides such as $Nb_2O_5$, TiO2, NiO, $Al_2O_3$, which have a nonstoichiometric composition and are used as a resistance change material; a chalcogenide material, which is kept amorphous without any phase changes by flowing a high current like a phase change random access memory (PRAM) so as to use a resistance change resulting from a change of the threshold voltage of an ovonic switch; materials $SrTiO_3$ and $SrZrO_3$ is doped with Cr or Nb to change a resistance state; and programmable metallization cells, created by doping Ag having large ion mobility on solid electrolytes such as GeSe to have two resistance states depending on formation of a conductive channel in a medium by electrochemical reaction. Through embodiment of two resistance states, such materials having a memory characteristic or process methods have been reported.

FIG. 8 is a graph showing a current-voltage relation of the conventional ReRAM in a DC sweep mode.

An electric forming step is required to show memory movement of the ReRAM. A ReRAM material with a switching electrical characteristic is changed from a high resistance state to a low resistance state by the electric formation.

In case of binary oxides, as the voltage applied to the device is increased after the electric forming step, the current follows the curve (a) of the low resistance state (Low R). When the voltage applied to the device reaches a critical value, the current shows a negative differential resistance as shown by (b).

As shown by curve (c), the current maintains the high resistance state (High R) to a given voltage, and when the voltage reaches a set voltage Vset, the current changes to the low resistance state (Low R) as shown in (d). When an electrical signal is a pulse a reset voltage Vreset and the set voltage Vset are applied to obtain the High R and the Low R.

The set voltage Vset, corresponding to an erase voltage Verase, has a higher voltage value than that of the reset voltage Vreset, corresponding to a write voltage Vwrite. A read voltage Vread has a lower voltage value than that of the reset voltage Vreset.

However, the ReRAM using the RSD requires a large write current for writing data in cells. As such, the number of cells to which data can be written simultaneously is limited resulting in degraded write performance.

BRIEF SUMMARY OF THE INVENTION

The present invention includes a semiconductor memory device solving the above described problems.

An embodiment of the present invention writes data simultaneously in a plurality of cells without increasing the write current, thereby reducing the write time of a memory device using a phase change resistor.

Additionally, an embodiment of the present invention writes data simultaneously in a plurality of cells without increasing the write current, thereby reducing the write time in a memory device using a MTJ cell.

Additionally, an embodiment of the present invention writes data simultaneously in a plurality of cells without increasing the write current, thereby reducing the write time in a memory device using a is RSD.

Additionally, an embodiment of the present invention improves cell structure by reducing cell size through application of a phase change resistor (PCR) to a DRAM.

Additionally, an embodiment of the present invention embodies a semiconductor memory device including a switching element and a phase change resistor for performing refresh operations, which improve a data retention characteristic.

Additionally, an embodiment of the present invention keeps data of a phase change memory device when a power is off while performing a refresh operation with a specific cycle to restore degraded cell data to improve a data retention characteristic.

Additionally, an embodiment of the present invention performs a refresh operation based on parameter information stored in the nonvolatile register when a power is off, so as to save refresh information even when the power is off.

Additionally, an embodiment of the present invention sets the whole data retention time including on/off periods of the power not to perform a refresh operation frequently, thereby reducing power consumption and improving operating performance.

According to an embodiment of the present invention, a semiconductor memory device comprises: a read/write bit line configured to supply a cell driving voltage; a selecting unit connected to the read/write bit line and controlled by the word line; a plurality of cells connected serially between the selecting unit and a source line and configured to read/write data depending on the cell driving voltage; and a plurality of switching elements connected in parallel to the cells and controlled selectively by the plurality of bit lines.

According to an embodiment of the present invention, a semiconductor memory device comprises: a cell array including a phase change resistance cell configured to read/write data; a register configured to store information of the cell array; and a refresh control unit configured to perform a refresh operation with a specific refresh cycle using information stored in the register so as to improve data retention of the cell array.

According to an embodiment of the present invention, a semiconductor memory device comprises: a cell array including a phase change resistance cell configured to read/write data; and a refresh control unit configured to perform a refresh operation with a specific refresh cycle using information stored in the register so as to improve data retention the cell array. The cell array includes: a read/write bit line configured to supply a cell driving voltage; a selecting unit connected to the read/write bit line and controlled by the word line; a plurality of cells connected serially between the selecting unit and a source line and configured to read/write data depending on the cell driving voltage; and a plurality of switching elements connected in parallel to the cells and controlled selectively by a plurality of bit lines.

According to an embodiment of the present invention, a refresh method of a semiconductor memory device comprises: sensing changes in crystallization induced through application of currents through the bit line so as to read/write data in the cell array including a phase change resistor configured to store data corresponding to resistance change; and refreshing data of the cell array with a specific refresh cycle so as to improve data retention of the cell array.

DESCRIPTION OF SPECIFIC EMBODIMENTS

Figure 1:
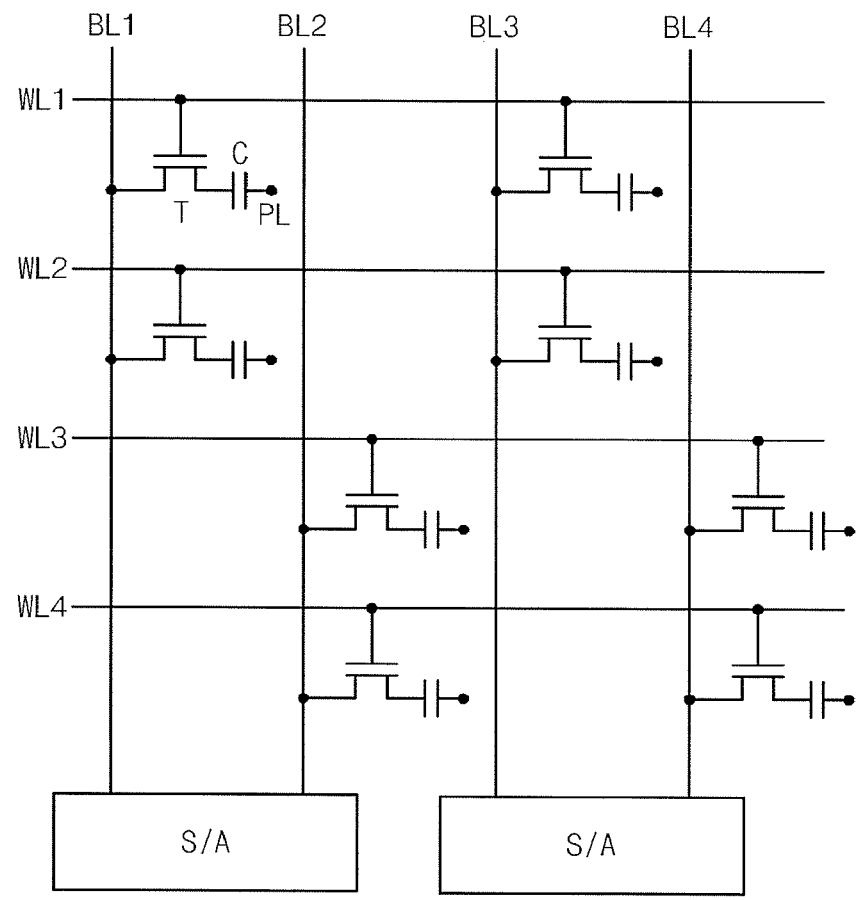
FIG. 1 is a diagram showing a cell array of a conventional DRAM.
Figure 2A:
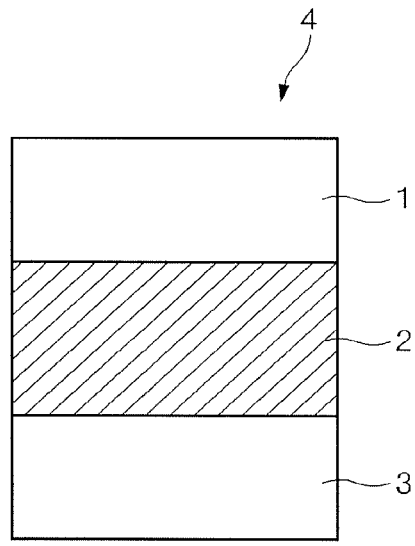
FIGS. 2a and 2b are diagrams showing a conventional phase change resistor.
Figure 2B:
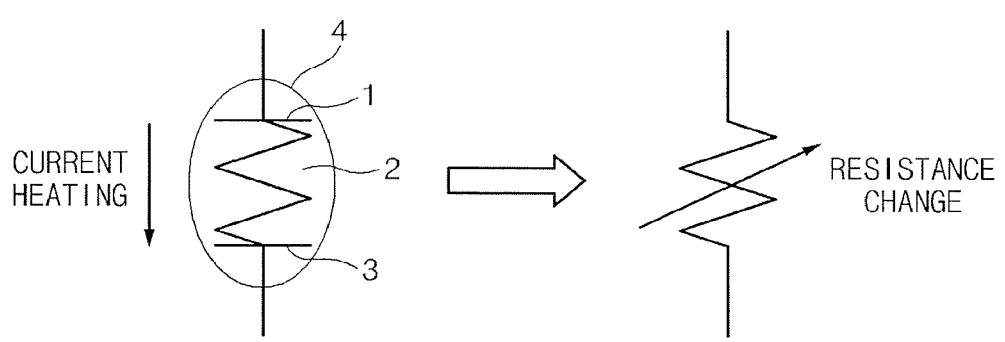
Figure 3A:
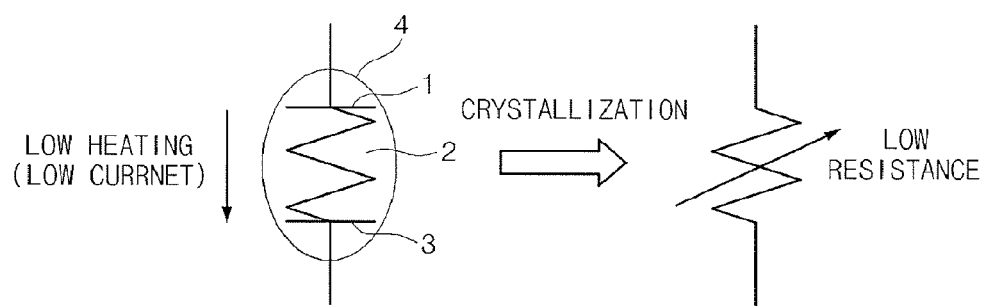
FIGS. 3a and 3b are diagrams showing an operating principle of the conventional phase change resistor shown in FIGS. 2a and 2b.
Figure 3B:
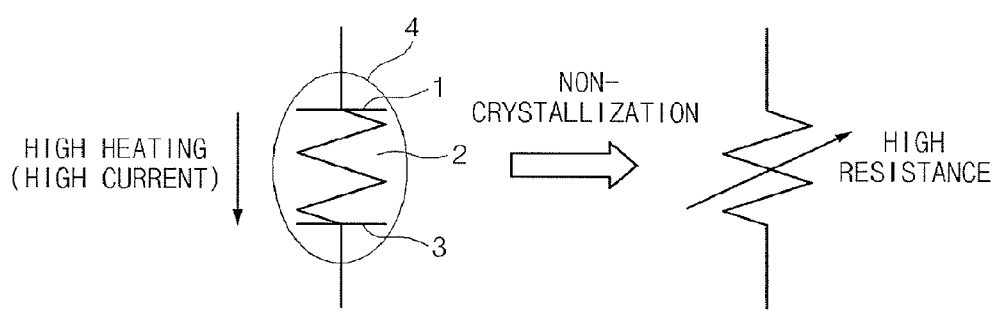
Figure 4:
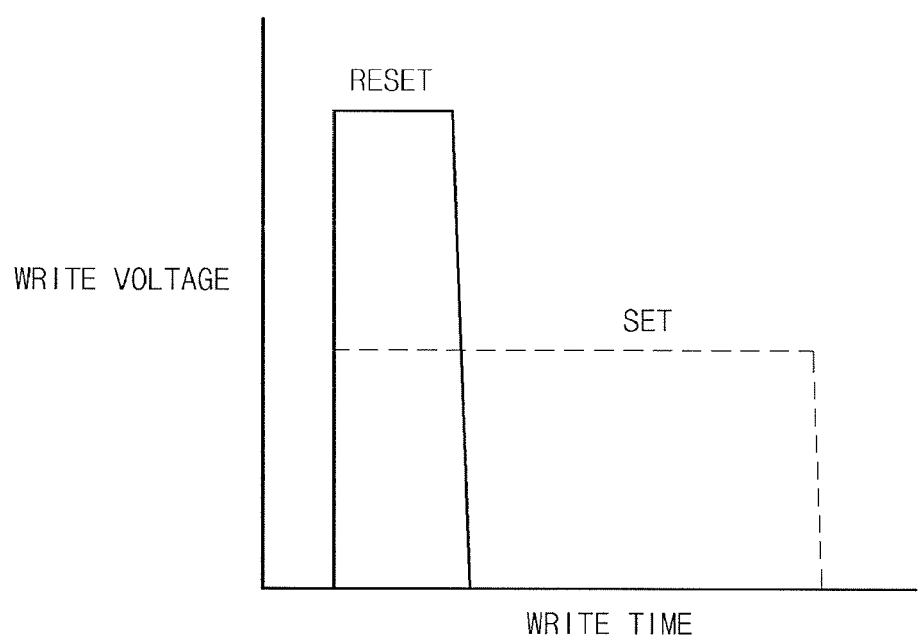
FIG. 4 is a diagram showing the write operation of a conventional phase change resistance cell.
Figure 5A:
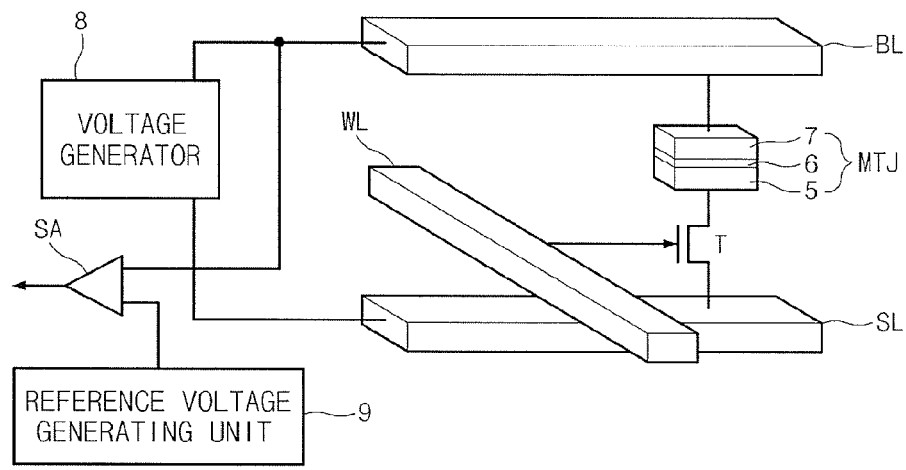
FIGS. 5a and 5b are diagrams showing a cell array of a conventional MRAM.
Figure 5B:
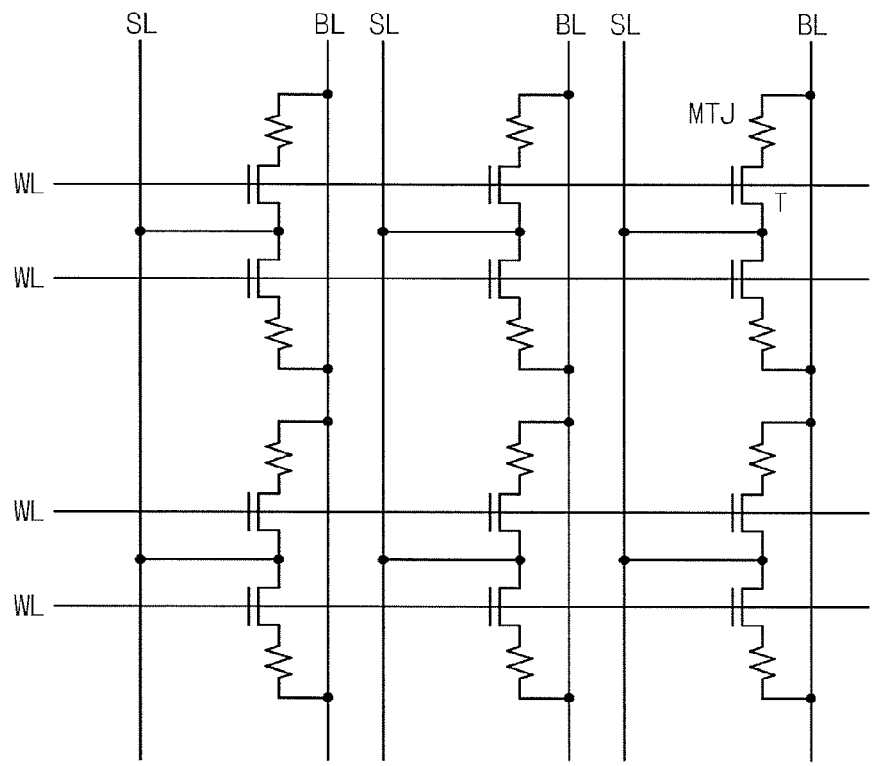
Figure 6A:
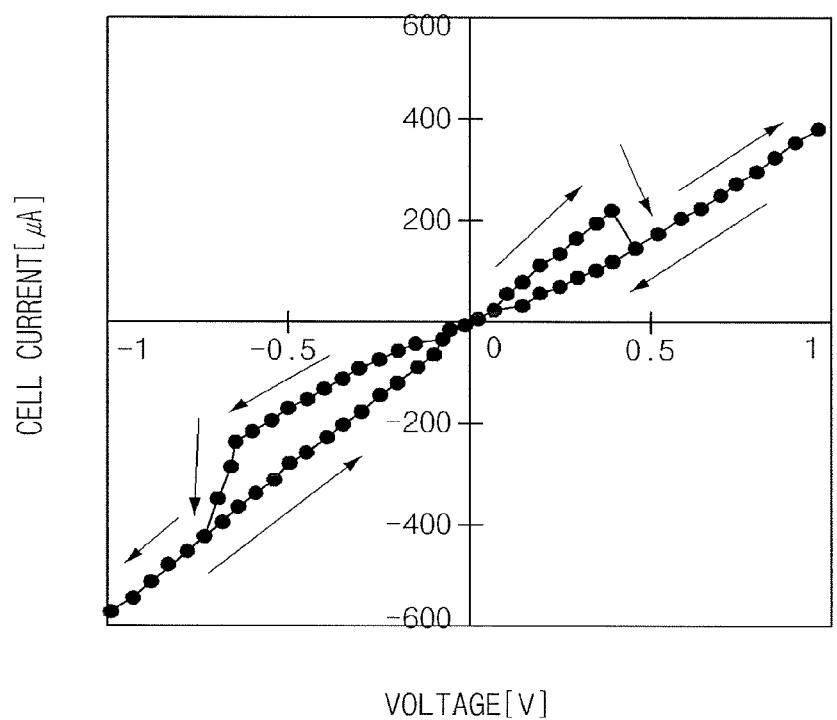
FIGS. 6a and 6b are graphs showing currents and resistance fluctuation curves of the conventional MRAM.
Figure 6B:
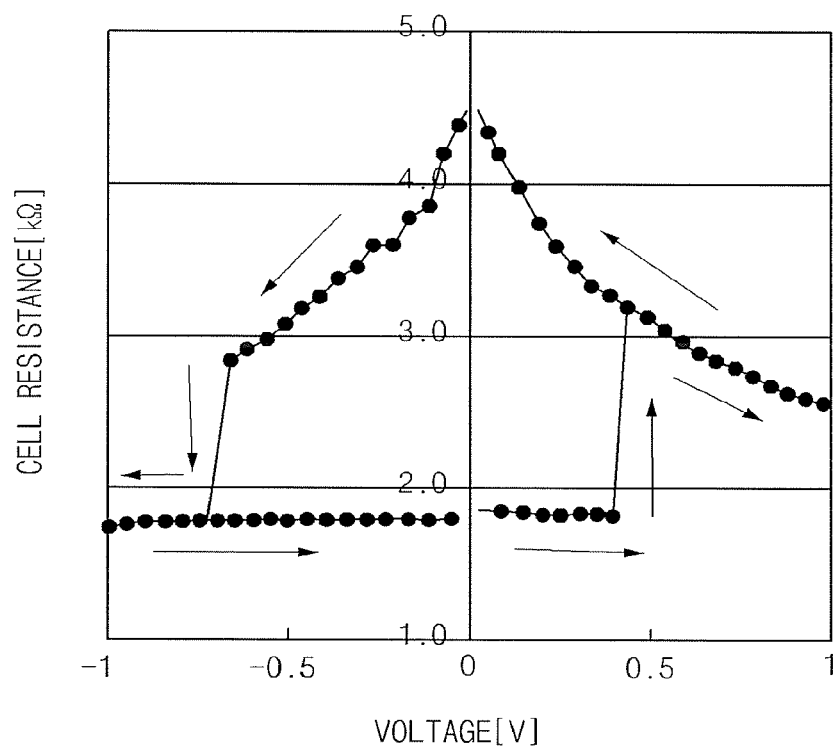
Figure 7:
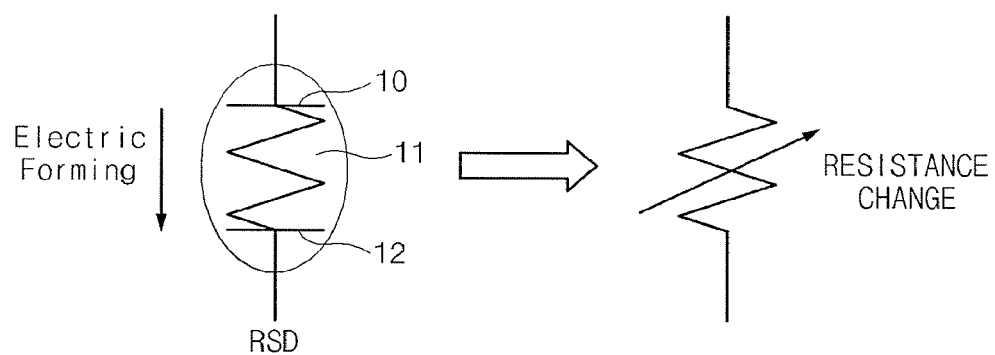
FIG. 7 is a diagram showing a RSD of a conventional ReRAM.
Figure 8:
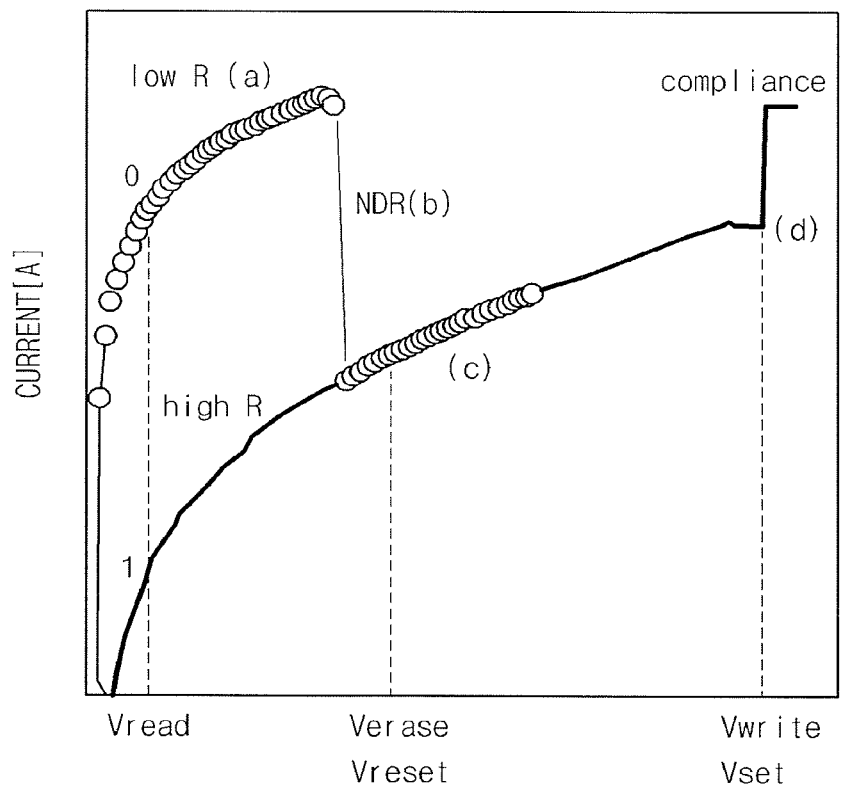
FIG. 8 is a graph showing a current-voltage relation of the conventional RERAM.
Figure 9:
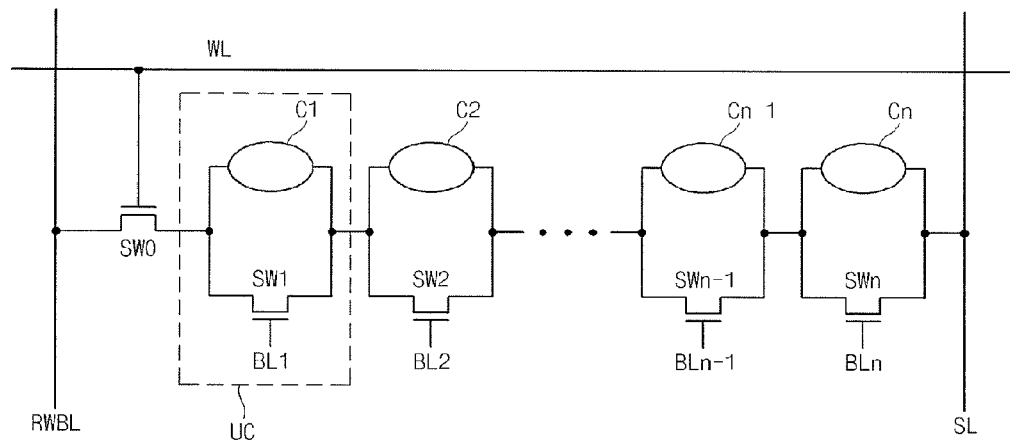
FIG. 9 is a circuit diagram showing a semiconductor memory device according to an embodiment of the present invention.

FIG. 9 is a circuit diagram showing a semiconductor memory device according to an embodiment of the present invention.

The semiconductor memory device of FIG. 9 comprises a to selecting switch SW0, a plurality of cells C1~Cn, and a plurality of switching elements SW1~SWn.

The selecting switch SW0 includes a NMOS transistor. The selecting switch SW0 is connected between a read/write bit line RWBL and a unit cell UC, and the gate of the selecting switch is connected to a word line WL.

In each unit cell UC a cell C1 is connected in parallel to a switching element SW1. The cell C1 has one electrode connected to the source of the switching element SW1 and the other electrode connected to the drain of the switching element SW1. Gates of the switching elements SW1~SWn are each connected one by one to a predetermined bit line of a plurality of bit lines BL1~BLn.

The cells C1~Cn are connected between the selecting switch SW0 and the source line SL. That is, the source of switching element SW1, which is connected in parallel to the cell C1, is connected to the drain of switching element SW2, which is connected in parallel to the cell C2. The first cell C1 of the cells C1~Cn is connected to the selecting switch SW0, and the final cell Cn is connected to the source line SL.

The word line WL represents a signal outputted from a row decoder to select a plurality of bits in common. As a result, the bits can be simultaneously stored in the cells C1~Cn depending on turning-on of the selecting switch SW0 in activation of the word line WL. Each of the bit lines BL1~BLn corresponds to a data line for transmitting one bit data information to each of the cells C1~Cn.

The above described cell C may be a PRAM including a PCR. Also, the above described cell C may be a MRAM including a MTJ. Alternatively, the above described cell C may be a ReRAM including a RSD.

Figure 10:
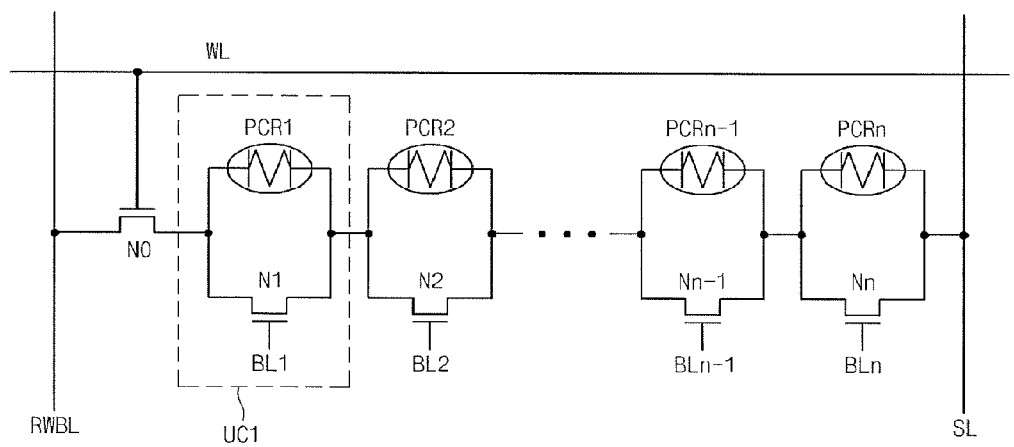
FIG. 10 is a circuit diagram showing a semiconductor memory device according to an embodiment of the present invention.

FIG. 10 is a circuit diagram showing a semiconductor memory device when the cell C includes a phase change resistor (PCR) according to an embodiment of the present invention.

The semiconductor memory device of FIG. 10 comprises a selecting switch N0, a plurality of phase change resistance cells PCR1~PCRn, and a plurality of switching elements N1~Nn.

The selecting switch N0 and the switching elements N1~Nn include NMOS transistors. The selecting switch N0 is connected between the read/write bit line RWBL and the unit cell UC1, and the gate of the selecting switch N0 is connected to a word line WL.

In the unit cell UC1, a switching element N1 is connected in parallel to a phase change resistance cell PCR1. The phase change resistance cell PCR1 has a first electrode connected to the source of the switching element N1 and a second electrode connected to the drain of the switching element N1. Gates of the switching elements N1~Nn are each connected one by one to a predetermined bit line of a plurality of bit lines BL1~BLn.

The phase change resistance cells PCR1~PCRn are connected between the selecting switch N0 and the source line SL. That is, the source of the selecting switch 2, which is connected in parallel to the phase change resistance cell PCR1, is connected to the drain of the selecting switch N2, which is connected in parallel to the neighboring phase change resistance cell PCR2. The first phase change resistance cell PCR1 of the phase change resistance cells PCR1~PCRn is connected to the selecting switch N0, and the final phase change resistance cell PCRn is connected to the source line SL.

Figure 11A:
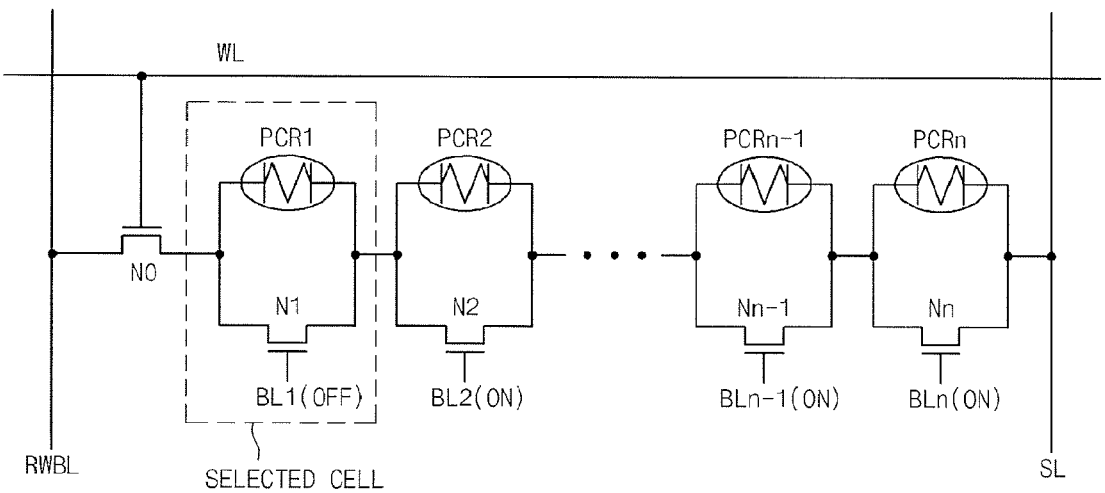
FIGS. 11a and 11b are a circuit diagram and a read mode waveform diagram, respectively, illustrating the semiconductor memory device shown in FIG. 10.
Figure 11B:
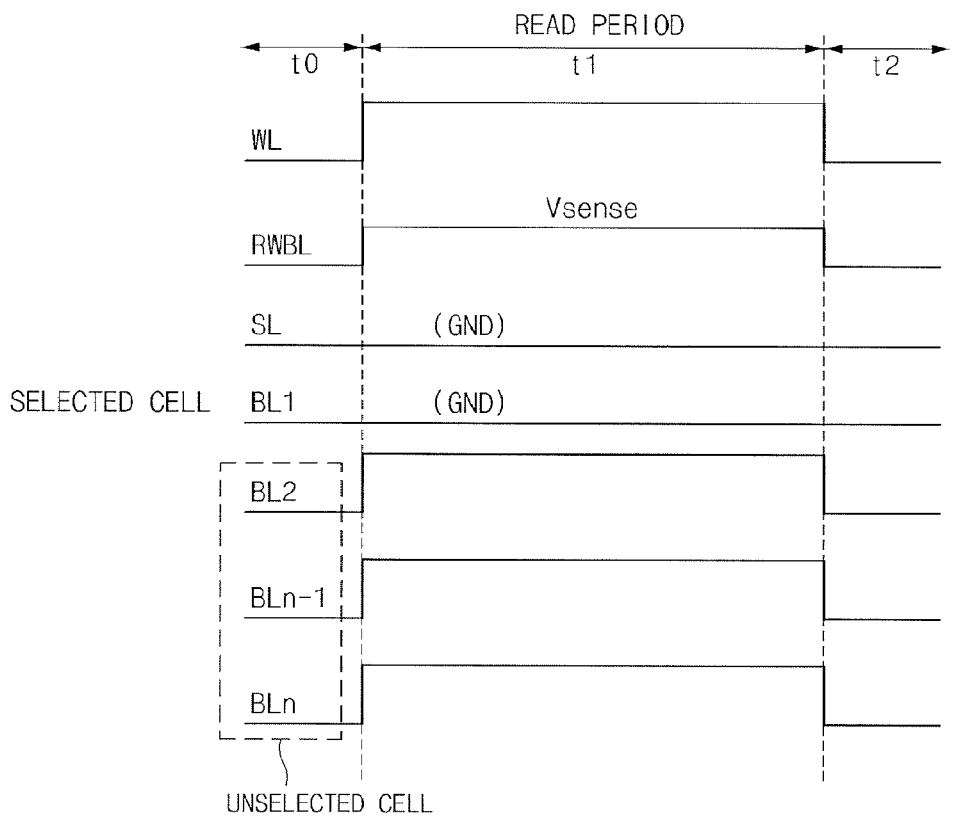

FIGS. 11a and 11b are a circuit diagram and a read mode waveform diagram, respectively, showing the semiconductor memory device shown in FIG. 10.

Suppose that the first unit cell including the phase change resistance cell PCR1 and the switching element N1 is selected in a read mode. In this case, low voltage is applied to the bit line BL1 connected to the selected cell, such that the selected unit cell remains in the off state. A high voltage is applied to the bit lines BL2~BLn connected to the remaining unselected cells, such that the unselected unit cells remain in the on state.

As shown in FIG. 11a, during the period to, the word line WL, the read/write bit line RWBL, the source line SL, and the bit lines BL1~BLn are maintained at a low level. As a result, the selecting switch N0 remains off to thereby disconnect the unit cell from the read/write bit line RWBL.

When the read period t1 starts, the word line WL transitions to a high level. As a result, the selecting switch N1 is turned on, thereby connecting the read/write bit line RWBL to the phase change resistance cell PCR1 of the selected unit cell.

The source line SL is maintained at a ground voltage level. The ground voltage is applied to the bit line BL1 connected to the selected cell such that the switching element N1 remains off.

The remaining bit lines BL2~BLn connected to the unselected cells N2-Nn are transitioned to a high voltage level. As a result, the switching elements N2~N5 connected to the remaining bit lines BL2~BLn are turned on such that they are serially connected between the phase change resistance cell PCR1 and the source line SL.

A sensing voltage Vsense, for sensing data selected from cell driving voltages, is applied to the read/write bit line RWBL. As a result, the current read in the phase change resistance cell PCR1 corresponding to the selected unit cell flows between the read/write bit line RWBL and the source line SL.

Figure 12A:
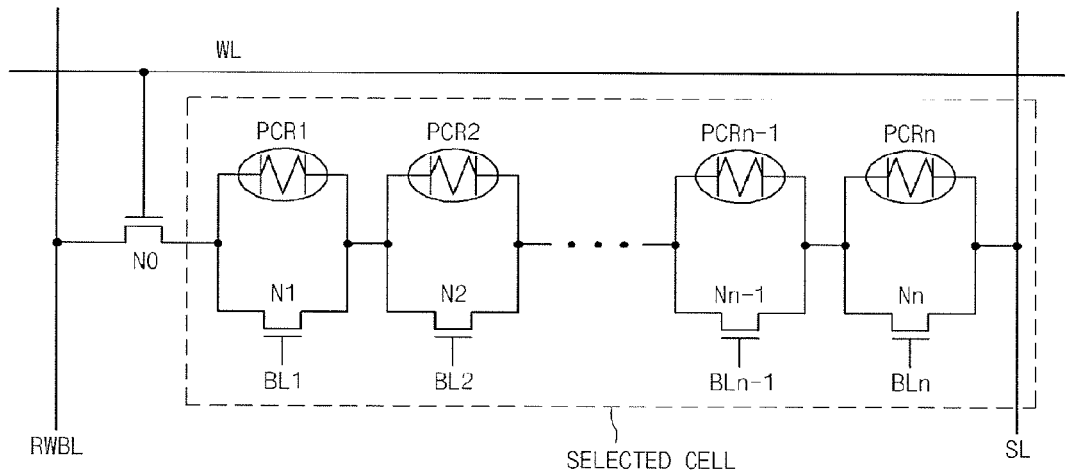
FIGS. 12a and 12b are a circuit diagram and a write mode waveform diagram, respectively, showing the semiconductor memory device shown in FIG. 10.
Figure 12B:
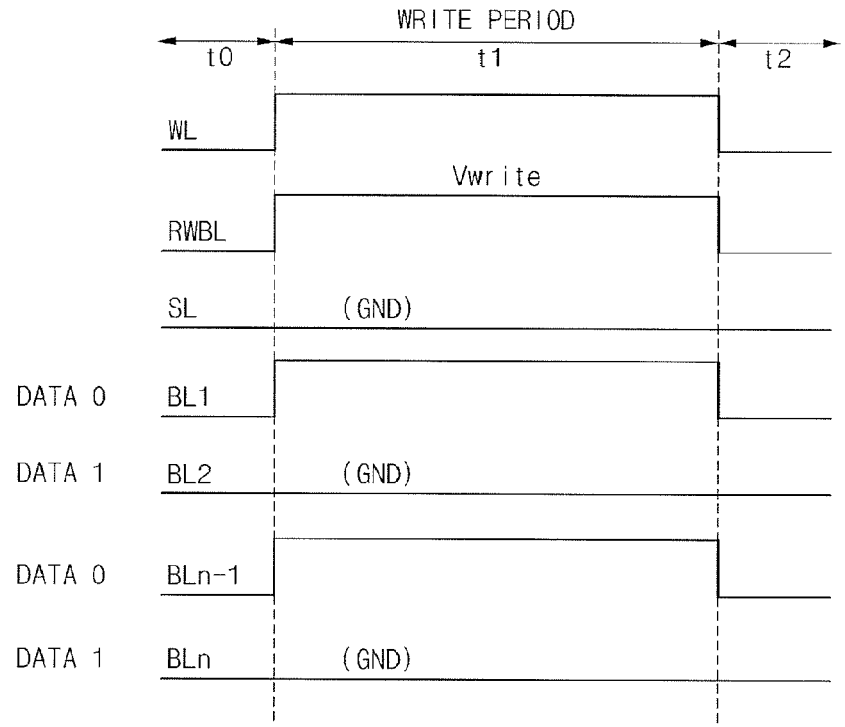

FIGS. 12a and 12b are a circuit diagram and a write mode waveform diagram, respectively, showing an embodiment of the semiconductor memory device shown in FIG. 10.

When all unit cells connected between the selecting switch N0 and the source line SL are selected in the write mode, voltages applied to the bit lines BL1~BLn connected to all unit cells are selectively adjusted to write corresponding data simultaneously in the phase change resistance cells PCR1~PCRn.

In the time period t0, as shown in FIG. 12b, the word line WL, the read/write bit line RWBL, the source line SL, and the bit lines BL1~BLn are maintained all at a low level. As a result, the selecting switch N0 remains off so as to disconnect the unit cell from the is read/write bit line RWBL.

When a write period t1 starts, the word line WL transitions to a high level. As a result, the selecting switch N0 is turned on so as to connect the read/write bit line RWBL to the phase change resistance cell PCR1 among all unit cells.

The source line SL is maintained at a ground voltage level. A write voltage Vwrite, for writing data, is applied to the read/write bit line RWBL. As a result, data corresponding to the phase change resistance cells PCR1~PCRn are simultaneously written.

For example, when a set state (logic data "0") is written in the phase change resistance cell PCR1, the bit line BL1 connected to the phase change resistance cell PCR1 transitions to a high level. As a result, the switching element N1 is turned on so as to apply the write voltage Vwrite applied through the selecting switch N0 to the phase change resistance cell PCR1 and the switching element N1.

As a result, the write current flows while being divided in the phase change resistance cell PCR1 and the switching element N1. The current flowing in the phase change resistance cell PCR1 is lower to than the whole current to write the logic data "0" in the phase change resistance cell PCR1. That is, if the whole current flowing in the selecting switch N0 is a reset current, a set current lower than the reset current flows in the phase change resistance cell PCR1.

When a reset state, that is, a logic data "1" is written in the is phase change resistance cell PCR2, the bit line BL2 connected to the phase change resistance cell PCR2 is maintained at a low level. As a result, the switching element N2 is turned off such that the write voltage Vwrite applied through the selecting switch N0 is applied to the phase change resistance cell PCR2 and the switching element N2.

As a result, the write current flows in the phase change resistance cell PCR2. The current flowing in the phase change resistance cell PCR2 corresponds to the whole current to write the logic data "1" in the phase change resistance cell PCR1. That is, if the whole current flowing in the selecting switch N0 is a reset current, the reset current flows in the phase change resistance cell PCR2.

Also, when a set state (a logic data "0") is written in the phase change resistance cell PCRn-1, the bit line BLn-1 transitions to a high level. As a result, the switching element Nn-1 is turned on to apply the write voltage Vwrite applied through the selecting switch N0 is applied between the phase change resistance cell PCRn-1 and the switching element Nn-1.

As a result, a write current flows while being divided in the phase change resistance cell PCRn-1 and the switching element Nn-1. The current flowing in the phase change resistance cell PCRn-1 is lower than the whole current to write the logic data "0" in the phase change resistance cell PCRn-1. That is, if the whole current flowing in the selecting switch N0 is a reset current, a set current lower than is the reset current flows in the phase change resistance cell PCRn-1.

When a reset state (a logic data "1") is written in the phase change resistance cell PCRn, the bit line BLn connected to the phase change resistance cell PCRn is maintained at a low level. As a result, the switching element Nn is turned off such that the write voltage Vwrite applied through the selecting switch N0 is applied to the phase change resistance cell PCRn and the switching element Nn.

As a result, the write current flows in the phase change resistance cell PCRn. The current flowing in the phase change resistance cell PCRn corresponds to the whole current to write the logic data "1" in the phase change resistance cell PCRn. That is, if the whole current flowing in the selecting switch N0 is a reset current, the reset current flows in the phase change resistance cell PCRn.

In this way, the whole current flowing through the selecting switch N0 is the same, the smaller set current flows in the phase change resistance cells PCR1 and PCRn−1 where the set state is written, and the larger reset current flows in the phase change resistance cells PCR2 and PCRn where the reset state is written.

In the phase change resistance cells PCR1~PCRn, data is simultaneously written without increasing the write current. As a result, the write current for writing data in the cells can be reduced by 1/N in comparison with the prior art. Also, the write time for writing data in the cells can be reduced by 1/N in comparison with is the prior art.

Figure 13:
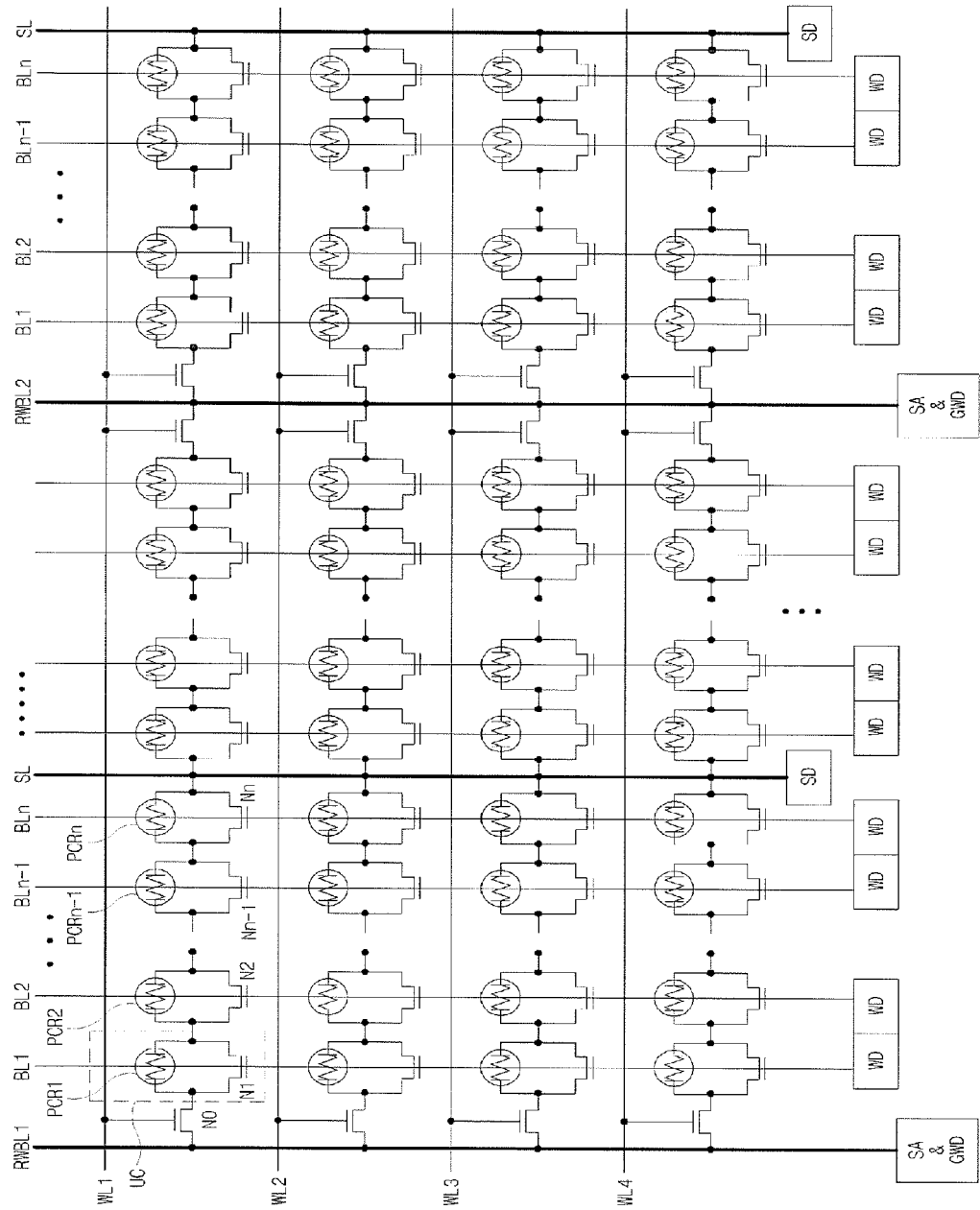
FIG. 13 is a diagram showing a cell array of the semiconductor memory device shown in FIG. 10.

FIG. 13 is a diagram showing a cell array of the semiconductor memory device shown in FIG. 10.

The cell array includes a plurality of read/write bit lines RWBL1~RWBLn arranged in a row direction, a plurality of bit lines BL1~BLn arranged in the row direction, and a plurality of word lines WL1~WLn arranged in a column direction.

The selecting switches N0 are positioned at intersections of the read/write bit lines RWBL1~RWBLn and the word lines WL1~WLn. The selecting switches N0 are arranged in the row and column directions.

The unit cells UC are positioned at intersections of the bit lines BL1~BLn and the word lines WL1~WLn. The unit cells UC are arranged in the row and column directions. One read/write bit line RWBL is shared by the selecting switches N1. One source line SL is shared by the unit cells UC.

Each read/write bit line RWBL is connected to a sense amplifier SA and a global write driving unit GWD. The sense amplifier SA senses and amplifies a sensing voltage Vsense applied through the read/write bit line RWBL in a read mode. The global write driving unit GWD supplies the write voltage Vwrite to the read/write bit line RWBL in the write mode.

Each bit line BL is connected to the write driving unit WD. In is the read mode or write mode, the voltage applied to the bit line BL is selectively controlled depending on the voltage of the write driving unit WD so as to select the corresponding unit cell UC.

The source line SL is connected to a source driving unit SD. In the read or write mode, a voltage applied to the source line SL is selectively controlled depending on the voltage (ground voltage) of the source driving unit SD.

Figure 14:
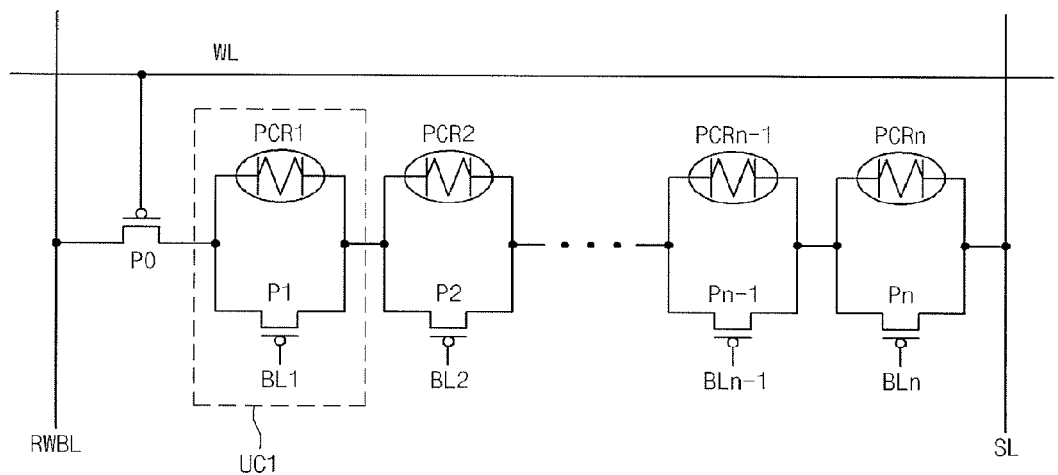
FIGS. 14 to 16 are diagrams showing examples of a semiconductor memory device according to an embodiment of the present invention.

FIG. 14 is a diagram showing a semiconductor memory device when the cell shown in FIG. 9 includes a phase change resistor (PCR).

The semiconductor memory device of FIG. 14 comprises a selecting switch P0, a plurality of phase change resistance cells PCR1~PCRn, and a plurality of switching elements P1~Pn.

The selecting switch P0 and the switching elements P1~Pn include PMOS transistors. The selecting switch P0 connected between the read/write bit line RWBL and the unit cell UC1, and the gate of the selecting switch P0 is connected to the word line WL.

Each unit cell UC1 includes a phase change resistance cell PCR1 and a switching element P1 connected in parallel. The phase change resistance cell PCR1 has one electrode connected to the drain of the switching element P1 and the other electrode connected to the source of the switching element P1. The switching elements P1~Pn have gates connected one by one to the bit lines BL1~BLn.

The phase change resistance cells PCR1~PCRn are connected is between the selecting switch P0 and the source line SL. That is, the drain of the selecting switch P1, which is connected in parallel to the phase change resistance cell PCR1, is connected to the source of selecting switch P2, which is connected in parallel to the phase change resistance cell PCR2. Of the phase change resistance cells PCR1~PCRn, the first phase change resistance cell PCR1 is connected to the selecting switch P0, and the final phase change resistance cell PCRn is connected to the source line SL.

Figure 15:
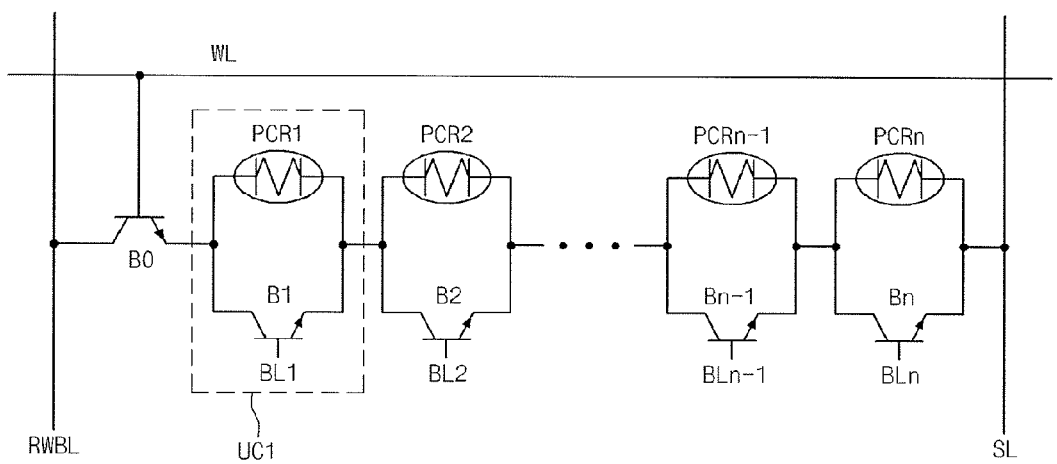

FIG. 15 is a diagram showing a semiconductor memory device when the cell shown in FIG. 9 includes a phase change resistor (PCR).

The semiconductor memory device of FIG. 15 comprises a selecting switch B0, a plurality of phase change resistance cells PCR1~PCRn, and a plurality of switching elements B1~Bn.

The selecting switch B0 and the switching elements B1~Bn include bipolar junction transistors (BJTs). Although the selecting switch B0 and the switching elements B1~Bn are exemplified as NPN-type BJTs, the present invention is not limited herein, but may include PNP-type BJTs.

The selecting switch B0 is connected between the read/write bit line RWBL and the unit cell UC1, the base terminal of the selecting switch B0 is connected to the word line WL. The selecting switch B0 has a collector terminal connected to the read/write bit line RWBL and an emitter terminal connected to the unit cell UC1.

Each unit cell UC1 includes a phase change resistance cell PCR1 and a switching element B1 that are connected in parallel. The phase change resistance cell PCR1 has one electrode connected to the collector terminal of the switching element B1 and the other electrode connected to the emitter terminal of the switching element B1.

The switching elements B1~Bn have base terminals connected one by one to the bit lines BL1~BLn. A first electrode of each phase change resistance cell PCR1~PCRn is connected to a collector terminal of the switching elements B1~Bn and a second electrode of each phase change resistance cell PCR1~PCRn is connected to an emitter terminal of the switching elements B1~Bn.

The phase change resistance cells PCR1~PCRn are connected between the selecting switch B0 and the source line SL. That is, the first electrode of the phase change resistance cell PCR1 is connected to the second electrode of the adjacent phase change resistance cell PCR2. Of the phase change resistance cells PCR1~PCRn, the first phase change resistance cell PCR1 is connected to the selecting switch B0, and the final phase change resistance cell PCRn is to connected to the source line SL.

Figure 16:
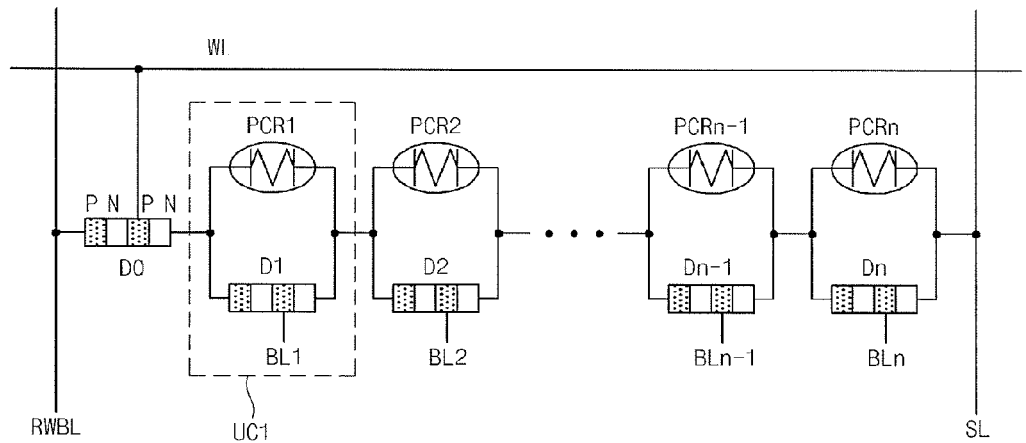

FIG. 16 is a diagram showing a semiconductor memory device when the cell shown in FIG. 9 includes a phase change resistor (PCR).

The semiconductor memory device of FIG. 16 comprises a selecting switch D0, a plurality of phase change resistance cells PCR1~PCRn, and a plurality of switching elements D1~Dn. The selecting switch D0 and the switching elements D1~Dn include PNPN diode switches. Although the selecting switch D0 and the switching elements D1~Dn are exemplified as PNPN diode elements, the present invention is not limited herein, but may include NPNP diode elements.

The selecting switch D0 is connected between the read/write bit line RWBL and the unit cell UC1, and the P-type region (Base) of the selecting switch D0 is connected to the word line WL. The selecting switch D0 has a P-type region (collector) connected to the read/write bit line RWBL and an N-type region (Emitter) connected to the unit cell UC1.

Each unit cell UC1 includes a phase change resistance cell PCR1 and a switching element D1 that are connected in parallel. The phase change resistance cell PCR1 has a first electrode connected to a P-type region (Collector) of the switching element D1 and a second electrode connected to a N-type region (Emitter) of the switching element D1. The switching elements D1~Dn have P-type regions (Base) connected one by one to the bit lines BL1~BLn. That to is, the Base of each switching element D1~Dn is connected to a single bit line BL1~BLn.

The phase change resistance cells PCR1~PCRn are connected between the selecting switch D0 and the source line SL. That is, the first electrode of the phase change resistance cell PCR1 is connected to the second electrode of the adjacent phase change resistance cell PCR2. Of the connected phase change resistance cells PCR1~PCRn, the first phase change resistance cell PCR1 is connected to the selecting switch D0, and the final phase change resistance cell PCRn is connected to the source line SL.

The structure and operating principles of the PNPN diode switch are disclosed in the U.S. Pat. No. 7,283,383 by the same inventor.

Figure 17:
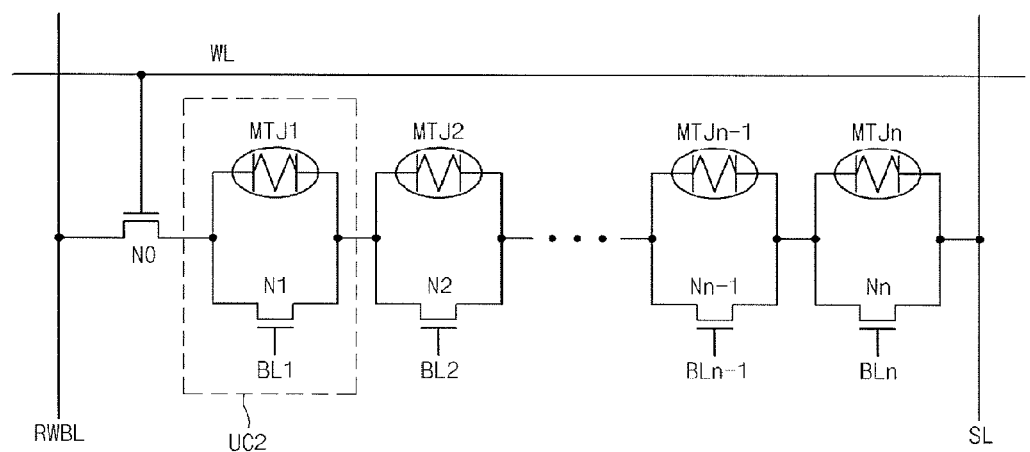
FIG. 17 is a circuit diagram showing a semiconductor memory device according to another embodiment of the present invention.

FIG. 17 is a diagram showing a semiconductor memory device when the cell C shown in FIG. 9 includes a Magnetic Tunnel Junction (MTJ) element.

The semiconductor memory device of FIG. 17 comprises a selecting switch N0, a plurality of MTJ cells MTJ1~MTJn, and a plurality of switching elements N1~Nn.

The selecting switch N0 includes an NMOS transistor. The selecting switch N0 is connected between the read/write bit line RWBL and the unit cell UC2 and the gate of the selecting switch N0 is connected to the word line WL.

Each unit cell UC2 includes a MTJ cell MTJ1 and a switching element N1 that are connected in parallel. The MTJ cell MTJ1 has a first electrode connected to the source of the switching element N1 and a second electrode connected to the drain of the switching is element N1. The switching elements N2~Nn have gates connected one by one to the bit lines BL1~BLn.

The MTJ cells MTJ1~MTJn are connected between the selecting switch N0 and the source line SL. That is, the source of the selecting switch N1, which is connected in parallel to the MTJ cell MTJ1, is connected to the drain of the switching element N2, which is connected in parallel to the MTJ cell MTJ2. Of the MTJ cells MTJ1~MTJn, the MTJ cell MTJ1 is connected to the selecting switch N0, and the final MTJ cell MTJn is connected to the source line SL.

Figure 18A:
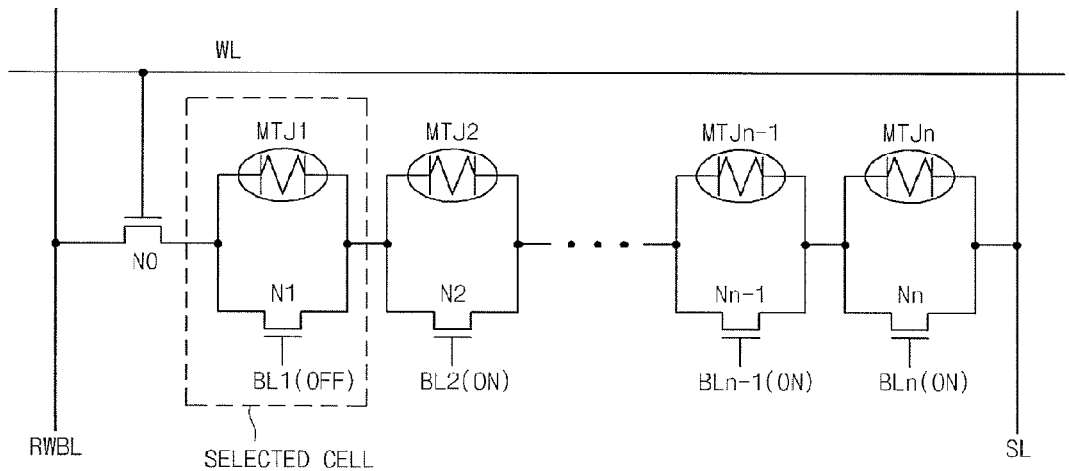
FIGS. 18a and 18b are a circuit diagram and a read mode waveform diagram showing the semiconductor memory device shown in FIG. 17.
Figure 18B:
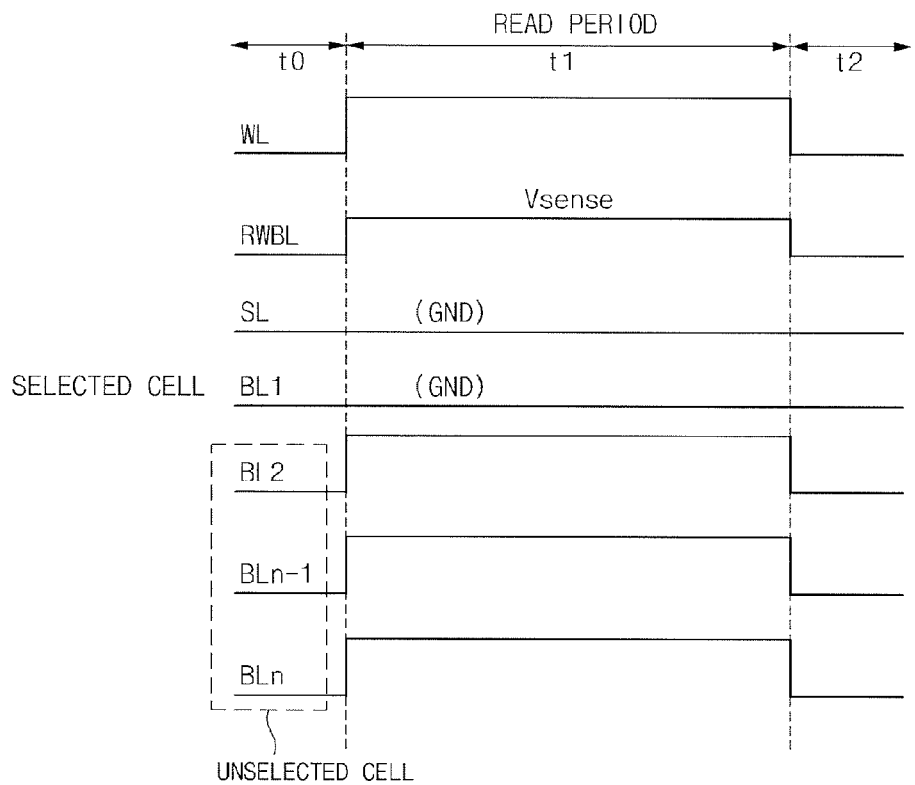

FIGS. 18a and 18b are a circuit diagram and a read mode waveform diagram respectively, showing the semiconductor memory device shown in FIG. 17.

When the first unit cell including the MTJ cell MTJ1 and the switching element N1 is selected in the read mode, a low voltage is applied to the bit line BL1 connected to the selected cell so that the selected unit cell maintains the off state. A high voltage is applied to the bit lines BL2~BLn connected to the reset unselected cells such that the unselected unit cells maintain the on state.

In the time period t0, the word line WL, the read/write bit line RWBL, the source line SL, and the bit lines BL1~BLn are maintained at a low level. As a result, the selecting switch N0 remains off to disconnect the read/write bit line RWBL from the unit cell.

When the read period t1 starts, the word line WL transitions to a high level. The selecting switch N0 is turned on to connect the MTJ cell MTJ1 of the selected unit cell to the read/write bit line RWBL.

The source line SL is maintained at a ground voltage level. A ground voltage is applied to the bit line BL1 connected to the selecting cell such that the switching element N1 remains off.

The remaining bit lines BL2~BLn, connected to the unselected cell, transition to a high level. The switching elements N2~Nn connected to the remaining bit lines BL2~BLn are turned on such that the switching elements N2~Nn are connected serially between the MTJ cell MTJ1 and the source line SL.

A sensing voltage Vsense for sensing data of cell driving voltages is applied to the read/write bit line RWBL. A current read in the MTJ cell MTJ1 corresponding to the selected unit cell flows between the read/write bit line RWBL and the source line SL.

Figure 19A:
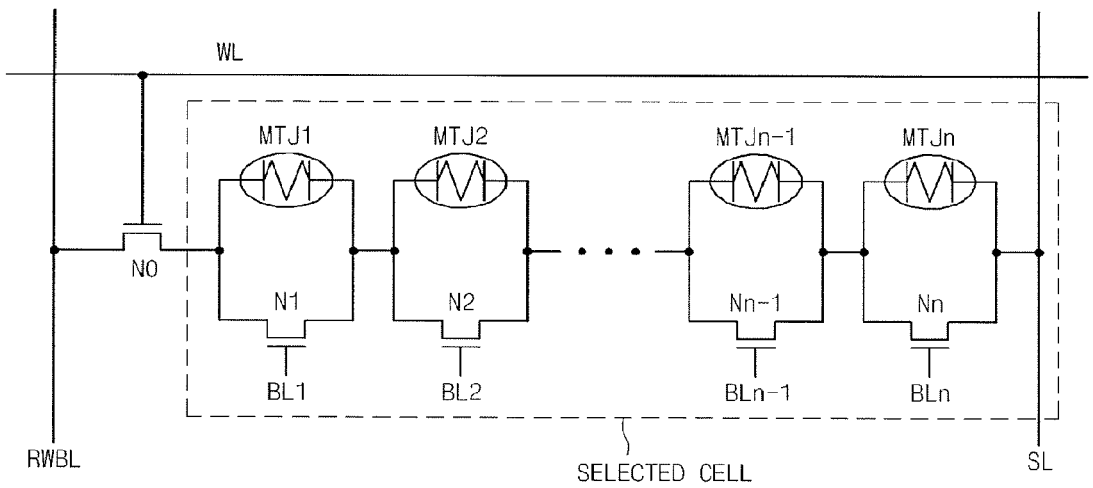
FIGS. 19a and 19b are a circuit diagram and a logic data "0" is write mode waveform diagram showing the semiconductor memory device shown in FIG. 17.
Figure 19B:
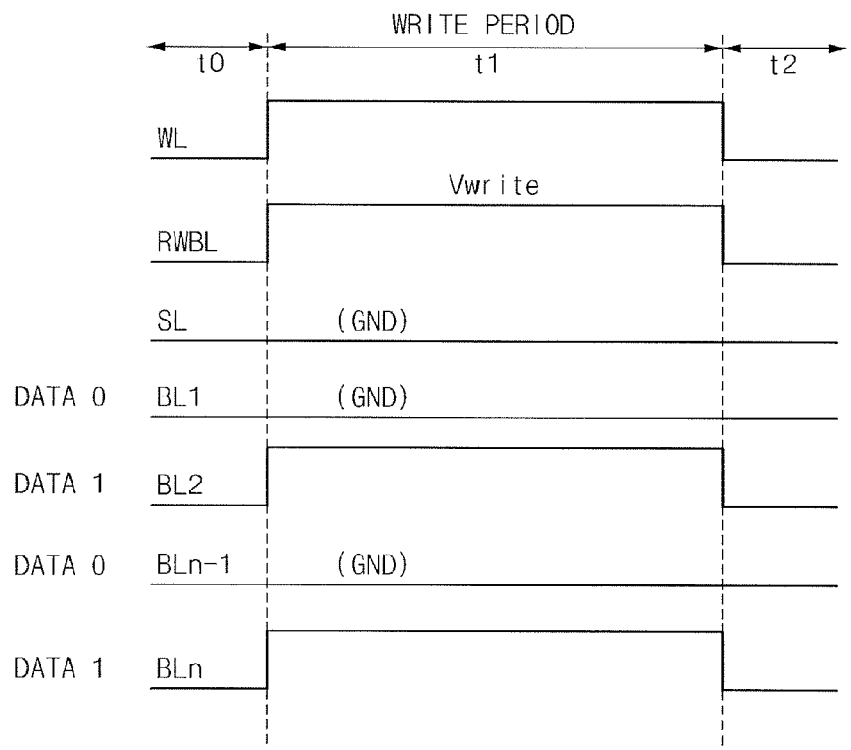

FIGS. 19a and 19b are a circuit diagram and a logic data "0" write mode waveform diagram, respectively, showing the semiconductor memory device shown in FIG. 17.

When each of the unit cells connected between the selecting switch N6 and the source line SL are selected in the write mode, a voltage applied to the bit lines BL1~BLn connected to all of the unit cells is selectively adjusted to write corresponding data simultaneously in the MTJ cells MTJ1~MTJn.

In the time period t0, the word line WL, the read/write bit line RWBL, the source line SL, and the bit lines BL1~BLn are maintained at a low level. As a result, the selecting switch N0 remains off to disconnect the read/write bit line RWBL from the unit cell.

When a write period t1 starts, the word line WL transitions to a high level. The selecting switch N0 is turned on connecting the MTJ cell MTJ1 to the read/write bit line RWBL.

The source line SL is maintained at a ground voltage level. A write voltage Vwrite for writing a logic data "0" of cell driving voltages is applied to the read/write bit line RWBL. As a result, current flows from the read/write bit line RWBL to the source line SL.

Data corresponding to the MTJ cells MTJ1~MTJn can be written simultaneously. That is, the MTJ cells MTJ1 and MTJn−1 for writing the logic data "0" from the MTJ cells MTJ1~MTJn are selected such that the logic data "0" can be written simultaneously. The MTJ cells MTJ2 and MTJn for writing the logic data "1" from the MTJ cells MTJ1~MTJn bypass a write current through the switching elements N2 and Nn.

For example, when the logic data "0" is written in the MTJ cells MTJ1 and MTJn−1, the bit lines BL1 and BLn−1, connected to the MTJ cells MTJ1 and MTJn−1, are maintained at a low level. The switching elements N1, Nn−1 are turned off such that the write voltage Vwrite applied through the selecting switch N0 is applied to only the MTJ cells MTJ1 and MTJn−1. As a result, the logic data "0" is written in the MTJ cells MTJ1 and MTJn−1.

The bit lines BL2 and BLn, connected to the MTJ cells MTJ2 and MTJn, transition to a high level for writing the logic data "1". As a result, the write current applied through the read/write bit line RWBL is bypassed through the switching elements N2 and Nn.

In this embodiment of the present invention, the logic data "0" can be written simultaneously in the MTJ cells MTJ1~MTJn−1 through the MTJ cells MTJ1~MTJn without an increase in the write current. As a result, the write current for writing data can be reduced by 1/N. Also, the write time for writing data can be reduced by 1/N.

Figure 20A:
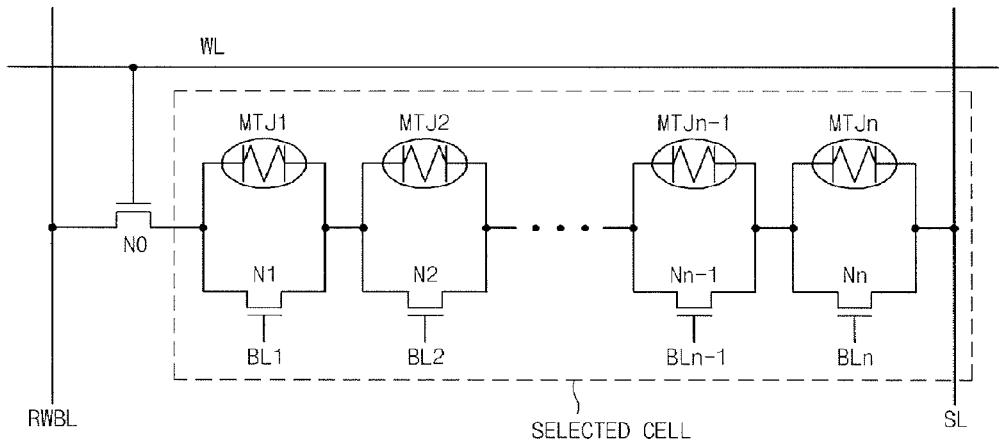
FIGS. 20a and 20b are a circuit diagram and a logic data "1" write mode waveform diagram showing the semiconductor memory device shown in FIG. 17.
Figure 20B:
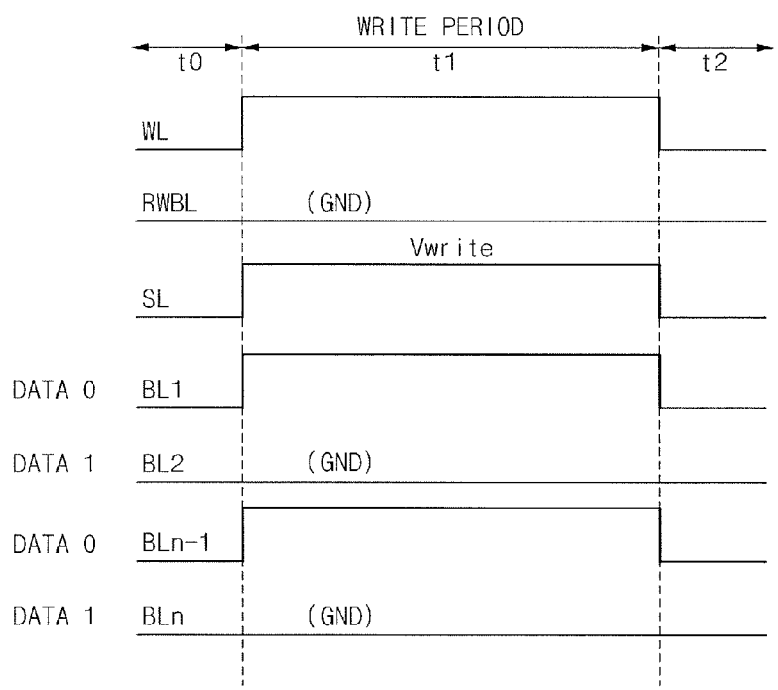

FIGS. 20a and 20b are a circuit diagram and a logic data "1" write mode waveform diagram, respectively, illustrating the semiconductor memory device shown in FIG. 17.

When all of the unit cells connected between the selecting switch N0 and the source line SL are selected in the write mode, a voltage applied to the bit lines BL1~BLn connected to all of the unit cells is selectively adjusted to write corresponding data simultaneously in the MTJ cells MTJ1~MTJn.

In a time period t0, the word line WL, the read/write bit line RWBL, the source line SL, and the bit lines BL1~BLn are maintained at a low level. As a result, the selecting switch N0 remains off to disconnect the read/write bit line RWBL from the unit cell.

When a write period t1 starts, the word line WL transitions to a high level. The selecting switch N6 is turned on to connect the MTJ cell MTJ1, of all of the unit cells, to the read/write bit line RWBL.

The read/write bit line RWBL is maintained at a ground voltage level. A write voltage Vwrite for writing a logic data "1" of cell driving voltages is applied to the source line SL. As a result, current flows from the source line SL to the read/write bit line RWBL.

Data corresponding to the MTJ cells MTJ1~MTJn can be written simultaneously. For example, the MTJ cells MTJ2 and MTJn for writing the logic data "1" from the MTJ cells MTJ1~MTJn are selected such that the logic data "1" can be written simultaneously. The MTJ cells MTJ1 and MTJn−1 for writing the logic data "0" from the MTJ cells MTJ1~MTJn bypass a write current through the switching elements N1, Nn−1.

For example, when the logic data "1" is written in the MTJ cells MTJ2 and MTJn, the bit lines BL2 and BLn, connected to the MTJ cells MTJ2 and MTJn, are maintained at a low level. The switching elements N2, Nn are turned off so that the write voltage Vwrite applied through the selecting switch N6 is applied to the MTJ cells MTJ2 and MTJn. As a result, the logic data "1" is written in the MTJ cells MTJ2 and MTJn.

The bit lines BL1 and BLn−1, connected to the MTJ cells MTJ1 and MTJn−1, for writing the logic data "0" transition to a high level. As a result, the write current applied through the read/write bit line RWBL bypasses through the switching elements N1, Nn−1.

In this embodiment of the present invention, the logic data "1" can be written simultaneously in the MTJ cells MTJ2~MTJn by the serially connected MTJ cells MTJ1~MTJn without an increase in the write current. As a result, data can be written simultaneously in the N cells by a current of high resistance to reduce the write current by 1/N. Also, the write time for writing data can be reduced by 1/N.

Figure 21:
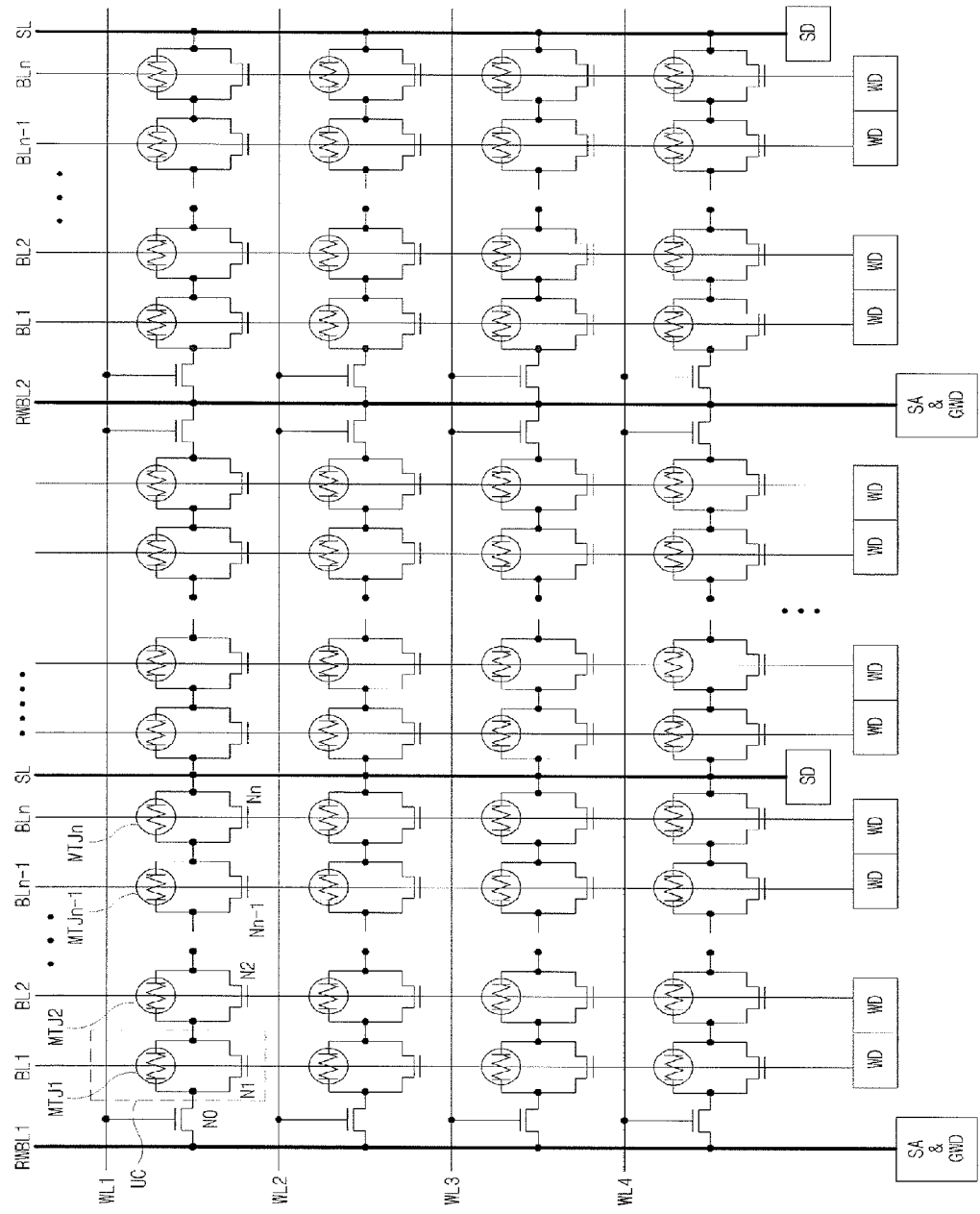
FIG. 21 is a diagram showing a cell array of the semiconductor memory device shown in FIG. 17.

FIG. 21 is a diagram showing a cell array of the semiconductor memory device shown in FIG. 17.

The cell array includes a plurality of read/write bit lines RWBL1~RWBLn arranged in a row direction, a plurality of bit lines BL1~BLn arranged in the row direction, and a plurality of word lines WL1~WLn arranged in a column direction.

The selecting switches N0 are positioned at the intersections of the read/write bit lines RWBL1~RWBLn and the word lines WL1~WLn. The selecting switches N6 are arranged in the row and column directions.

The unit cells UC are positioned at the intersections of the bit to lines BL1~BLn and the word lines WL1~WLn. The unit cells UC are arranged in the row and column directions. One read/write bit line RWBL is shared by the selecting switches N6. One source line SL is shared by the unit cells UC.

The read/write bit line RWBL is connected to a sense is amplifier SA and a global write driving unit GWD. The sense amplifier SA senses and amplifies a sensing voltage Vsense applied through the read/write bit line in a read mode. The global write driving unit GWD supplies the write voltage Vwrite or ground voltage GND to the read/write bit line RWBL in the write mode.

Each bit line BL is connected to a write driving unit WD. In the read or write mode, the voltage applied to the bit line BL is selectively controlled by the voltage of the write driving unit WD so as to select the corresponding unit cell UC.

The source line SL is connected to a source driving unit SD. In the read or write mode, the voltage applied to the source line SL is selectively controlled depending on a voltage (ground voltage or write voltage Vwrite) of the source driving unit SD.

Figure 22:
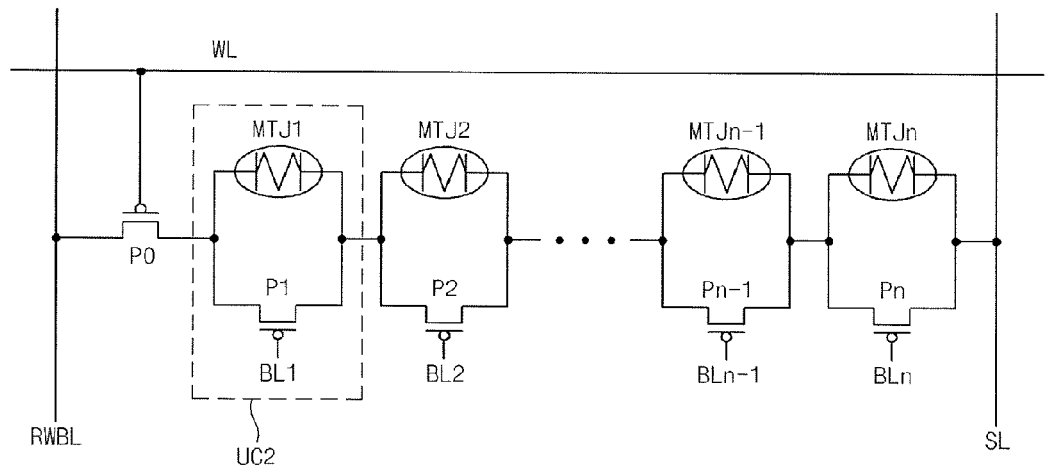
FIGS. 22 to 24 are diagrams showing examples of a semiconductor memory device according to an embodiment of the present invention.

FIG. 22 is a diagram showing a semiconductor memory device when the cell shown in FIG. 9 includes a MTJ element.

The semiconductor memory device of FIG. 22 comprises a selecting switch P0, a plurality of MTJ cells MTJ1~MTJn, and a plurality of switching elements P1~Pn.

The selecting switch P6 and the switching elements P1~Pn include PMOS transistors. The selecting switch P0 is connected between the read/write bit line RWBL and the unit cell UC2 and the gate of the selecting switch P0 is connected to the word line WL.

Each unit cell UC2 includes an MTJ cell MTJ1 and a switching element P1 that are connected in parallel. The MTJ cell MTJ1 has a first electrode connected to the drain of the switching element P1 and a second electrode connected to the source of the switching element P1. The switching elements P1~Pn have gates connected one by one to the bit lines BL1~BLn.

The MTJ cells MTJ1~MTJn are connected between the selecting switch P0 and the source line SL. That is, the drain of switching element P1, which is connected in parallel to the MTJ cell MTJ1, is connected to the source of the switching element P2, which is connected in parallel to the MTJ cell MTJ2. Of the MTJ cells MTJ1~MTJn, the MTJ cell MTJ1 is connected to the selecting switch P0, and the final MTJ cell MTJn is connected to the source line SL.

Figure 23:
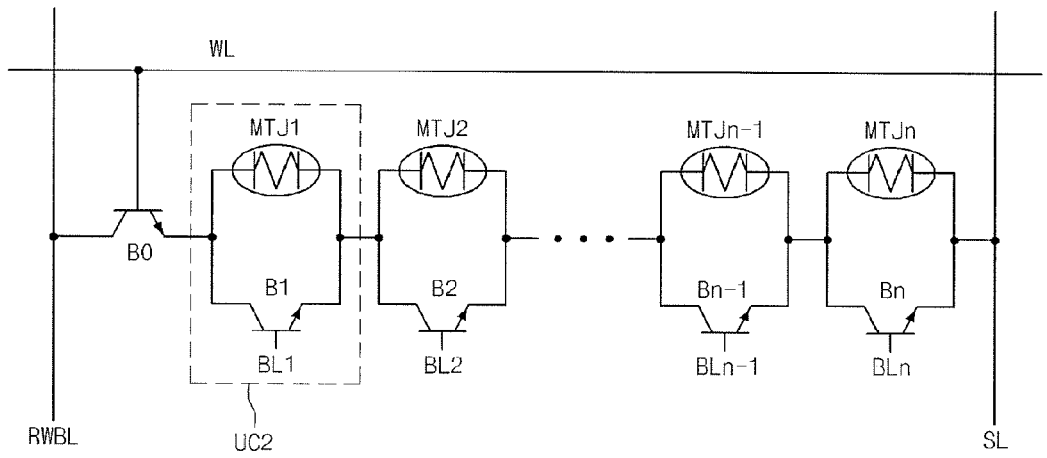

FIG. 23 is a diagram showing a semiconductor memory device when the cell shown in FIG. 9 includes a MTJ element.

The semiconductor memory device of FIG. 23 comprises a selecting switch B0, a plurality of MTJ cells MTJ1~MTJn and a plurality of switching elements B1~Bn.

The selecting switch B0 and the switching elements B1~Bn include bipolar junction transistors (BJTs). Although the selecting switch B0 and the switching elements B1~Bn are exemplified as NPN-type BJTs, the present invention is not limited herein, but may include PNP-type BJTs.

The selecting switch B0 is connected between the read/write bit line RWBL and the unit cell UC2, and the base terminal of the selecting switch B0 is connected to the word line WL. The selecting switch B0 has a collector terminal connected to the read/write bit line RWBL and an emitter terminal connected to the unit cell UC2.

Each unit cell UC2 includes a MTJ cell MTJ1 and a switching element B1 that are connected in parallel. The MTJ cell MTJ1 has a first electrode connected to the collector terminal of the switching element B1 and a second electrode connected to the emitter terminal of the switching element B1.

The switching elements B1~Bn have base terminals connected one by one to the bit lines BL1~BLn. Each MTJ cell has the first electrode connected to the collector terminals of the switching elements B1~Bn and the second electrode connected to the emitter terminals of the switching elements B1~Bn.

The MTJ cells MTJ1~MTJn are connected between the selecting switch B0 and the source line SL. That is, the first electrode of the MTJ cell MTJ1 is connected to the second electrode of the adjacent MTJ cell MTJ2. Of the MTJ cells MTJ1~MTJn, the first MTJ cell MTJ1 is connected to the selecting switch B0, and the final MTJ cell MTJn is connected to the source line SL.

Figure 24:
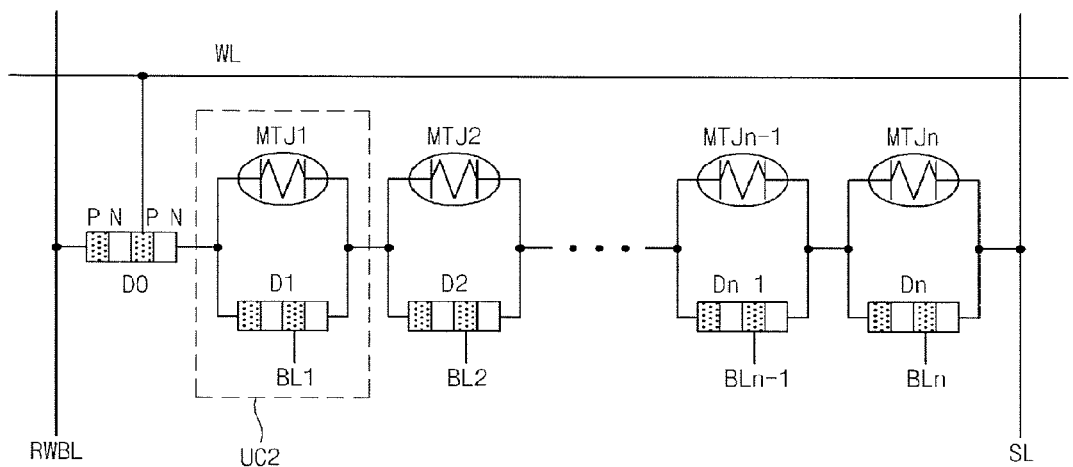

FIG. 24 is a diagram showing a semiconductor memory device when the cell shown in FIG. 9 includes a MTJ element.

The semiconductor memory device of FIG. 24 comprises a selecting switch D0, a plurality of MTJ cells MTJ1~MTJn, and a plurality of switching elements D1~Dn.

The selecting switch D6 and the switching elements D1~Dn include PNPN diode switches. Although the selecting switch D0 and the switching elements D1~Dn are exemplified as PNPN diode elements, the present invention is not limited herein, but may include NPNP diode elements.

The selecting switch D0 is connected between the read/write bit line RWBL and the unit cell UC2, the P-type region (Base) of the selecting switch D0 is connected to the word line WL. The selecting switch D0 has a collector terminal connected to the read/write bit line RWBL and a N-type region (Emitter) connected to the unit cell UC2.

Each unit cell UC2 includes a MTJ cell MTJ1 and a switching element D1 that are connected in parallel. The MTJ cell MTJ1 has a first electrode connected to the P-type region (Collector) of the switching element D1 and a second electrode connected to the N-type region (Emitter) of the switching element D4. The switching elements D1~Dn have P-type regions (Base) connected one by one to the bit lines BL1~BLn.

The MTJ cells MTJ1~MTJn are connected between the selecting switch D0 and the source line SL. That is, the first electrode of the MTJ cell MTJ1 is connected to the second electrode of the adjacent MTJ cell MTJ2. Of the MTJ cells MTJ1~MTJn, the first MTJ cell MTJ1 is connected to the selecting switch D0, and the final MTJ cell MTJn is connected to the source line SL.

The structure and operating principle of the PNPN diode switch are disclosed in the U.S. Pat. No. 7,283,383 by the same inventor.

Figure 25:
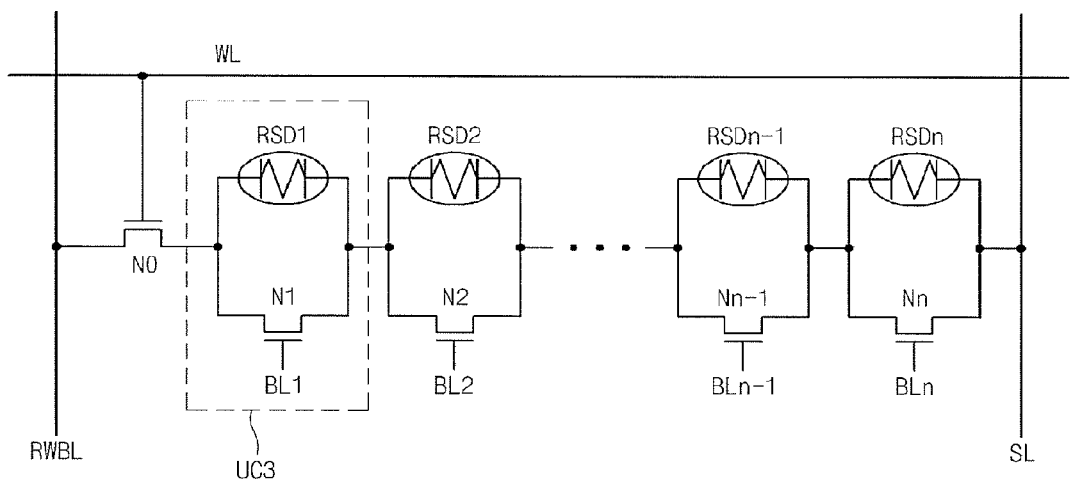
FIG. 25 is a circuit diagram showing a semiconductor memory device according to another embodiment of the present invention.

FIG. 25 is a circuit diagram showing a semiconductor memory device according to another embodiment of the present invention when the cell C of FIG. 9 includes a Resistive Switch Device (RSD).

The semiconductor memory device of FIG. 25 comprises a selecting switch N0, a plurality of RSD cells RSD1~RSDn, and a plurality of switching elements N1~Nn.

The selecting switch N11 and the switching elements N1~Nn include NMOS transistors. The selecting switch N0 is connected between the read/write bit line RWBL and the unit cell UC3, the gate of the selecting switch N0 is connected to the word line WL.

Each unit cell UC3 includes a RSD cell RSD1 and a switching element N1 that are connected in parallel. The RSD cell RSD1 has a first electrode connected to the source of the switching element N1 and a second electrode connected to the drain of the switching element N1. The switching elements N1~Nn have gates connected one by one to the bit lines BL1~BLn.

The RSD cells RSD1~RSDn are connected between the selecting switch N0 and the source line SL. That is, the source of the RSD cell RSD1 is connected to the drain of the RSD cell RSD2. Of the RSD cells RSD1~RSDn, the RSD cell RSD1 is connected to the is selecting switch N0, and the final RSD cell RSDn is connected to the source line SL.

Figure 26A:
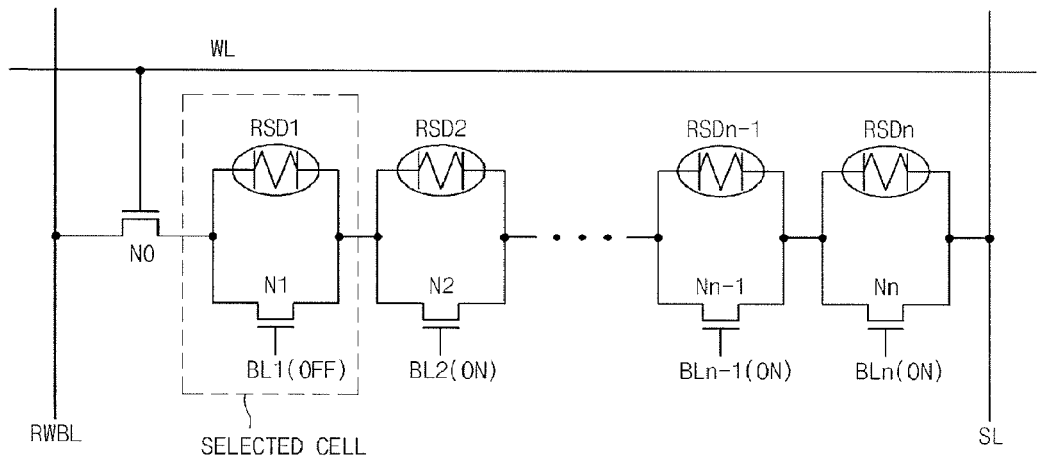
FIGS. 26a and 26b are a circuit diagram and a read mode waveform diagram showing the semiconductor memory device shown in FIG. 25.
Figure 26B:
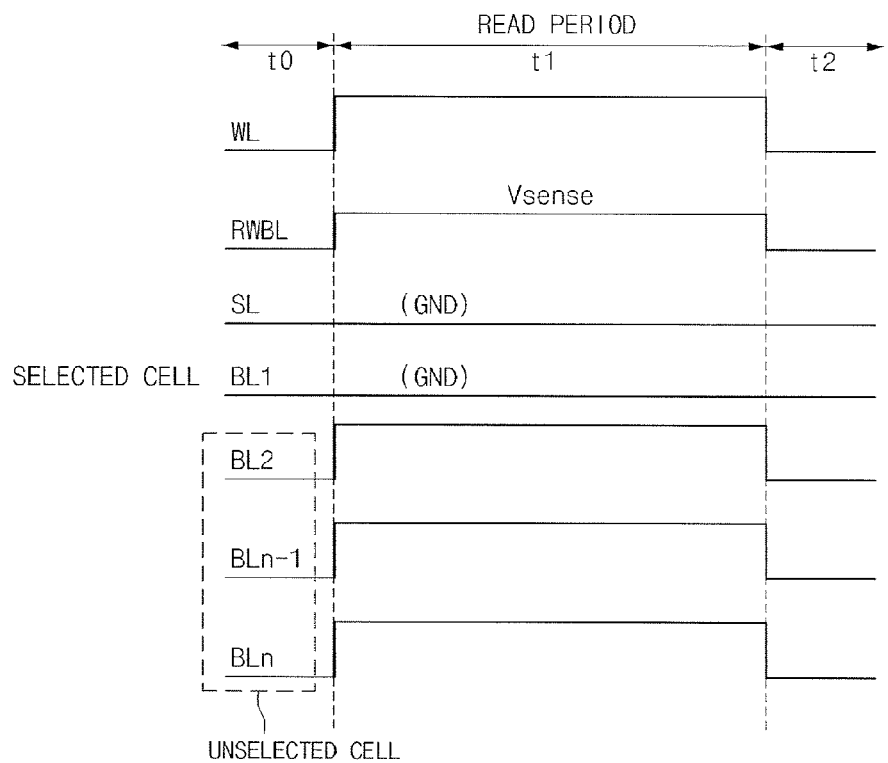

FIGS. 26a and 26b are a circuit diagram and a read mode waveform diagram, respectively, illustrating the semiconductor memory device shown in FIG. 25.

When the first unit cell including the RSD cell RSD1 and the switching element N1 is selected in the read mode, a low voltage is applied to the bit line BL1 connected to the selected cell such that the selected unit cell keeps turned-off. A high voltage is applied to the bit lines BL2~BLn connected to reset the unselected cells such that the unselected unit cells remain on.

In a time period t0, the word line WL, the read/write bit line RWBL, the source line SL, and the bit lines BL1~BLn are a; maintained at a low level. As a result, the selecting switch N0 remains off disconnecting the read/write bit line RWBL from the unit cell.

When a read period t1 starts, the word line WL transitions to a high level. The selecting switch N0 is turned on to connect the RSD cell RSD1 of the selected unit cell to the read/write bit line RWBL.

The source line SL is maintained at a ground voltage level. A ground voltage is applied to the bit line BL1 connected to the selecting cell such that the switching element N1 remains off.

The remaining bit lines BL2~BLn, which are connected to the unselected cell, transition to a high level. The switching elements N2~Nn are connected to the rest bit lines BL2~BLn and are turned on such that the switching elements N2~Nn are connected serially between the RSD cell RSD1 and the source line SL.

A sensing voltage Vsense for sensing the data of cell driving voltages is applied to the read/write bit line RWBL. A current read in the RSD cell RSD1 corresponding to the selected unit cell flows between the read/write bit line RWBL and the source line SL.

Figure 27A:
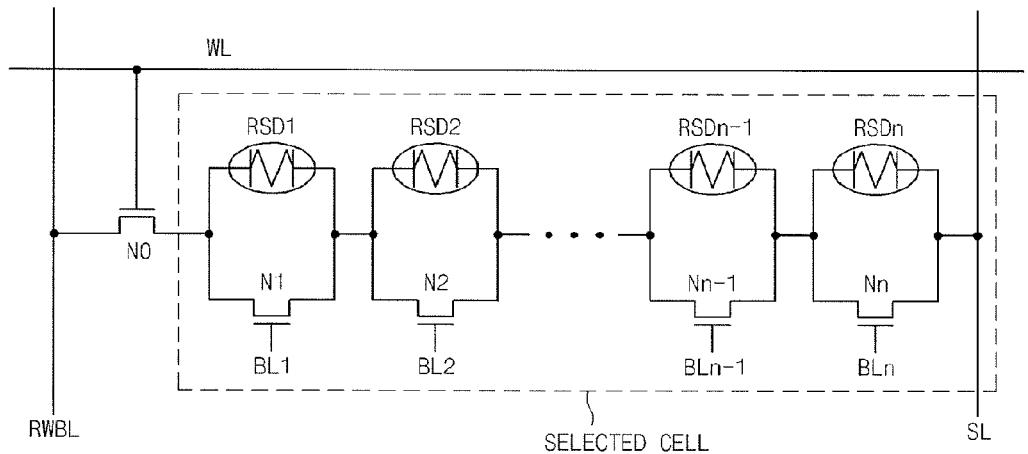
FIGS. 27a and 27b are a circuit diagram and a write mode waveform diagram showing the semiconductor memory device shown in FIG. 25.
Figure 27B:
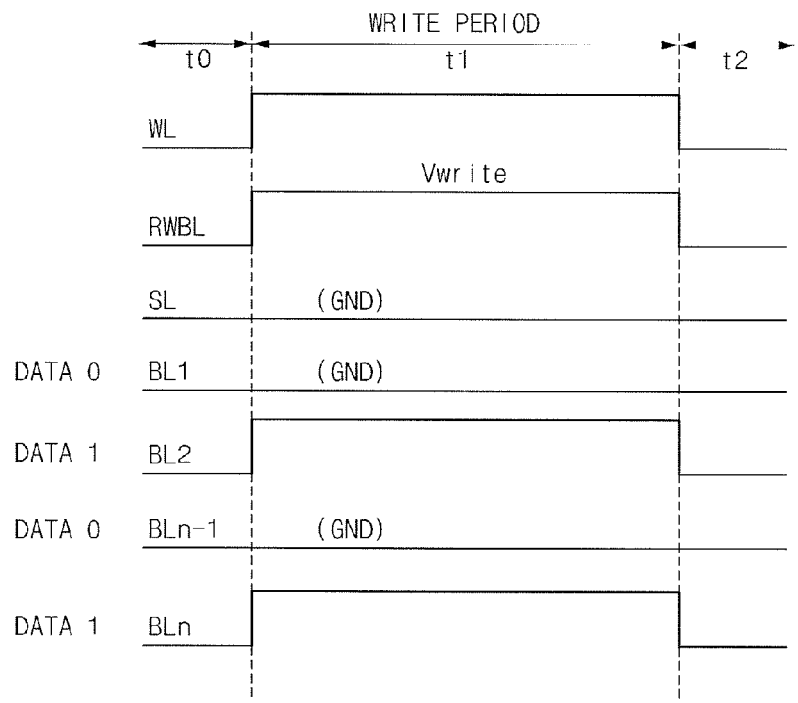

FIGS. 27a and 27b are a circuit diagram and a write mode waveform diagram, respectively, illustrating the semiconductor memory device shown in FIG. 25.

When all of the unit cells connected between the selecting switch N0 and the source line SL are selected in the write mode, a voltage applied to the bit lines BL1~BLn connected to all of the unit cells is selectively adjusted to write corresponding data simultaneously in the RSD cells RSD1~RSDn.

In a time period t0, the word line WL, the read/write bit line RWBL, the source line SL, and the bit lines BL1~BLn are maintained at a low level. As a result, the selecting switch N0 remains off to disconnect the read/write bit line RWBL from the unit cell.

When a write period t1 starts, the word line WL transitions to a high level. The selecting switch N0 is turned on to connect the RSD cell RSD1 of the selected unit cell to the read/write bit line RWBL.

The source line SL is maintained at a ground voltage level. A write voltage Vwrite for writing data of cell driving voltages is applied to the read/write bit line RWBL. As a result, data corresponding to the RSD cells RSD1~RSDn can be written simultaneously.

For example, when a set state (a logic data "0") is written in the RSD cell RSD1, the bit line BL1 connected to the RSD cell RSD1 is maintained at a low level. As a result, the switching element N1 is turned off and the write voltage Vwrite is applied through the selecting switch N0 to the RSD cell RSD1.

The write current flows only in the RSD cell RSD1. The current flowing in the RSD cell RSD1 corresponds to the whole current such that the logic data "0" is written in the RSD cell RSD1. That is, if the whole current flowing in the selecting switch N0 is a set current, a set current flows in the RSD cell RSD1.

When a reset state (a logic data "1") is written in the RSD cell RSD2, the bit line BL2 connected to the RSD cell RSD2 transitions to a high level. As a result, the switching element N2 is turned on such that the write voltage Vwrite applied through the selecting switch N0 is applied to the RSD cell RSD2 and the switching element N2.

As a result, the write current flows while being divided in the RSD cell RSD2 and the switching element N2. The current flowing in the RSD cell RSD2 is smaller than the whole current to write the logic data "1" in the RSD cell RSD2. That is, if the whole current flowing in the selecting switch N0 is a set current, a reset current lower than the set current flows in the RSD cell RSD2.

When a set state (a logic data "0") is written in the RSD cell RSDn-1, the bit line BLn-1 connected to the RSD cell RSDn-1 is maintained at a low level. As a result, the switching element Nn-1 is turned off to apply the write voltage Vwrite through the selecting switch N0 to the RSD cell RSDn-1.

The write current flows only in the RSD cell RSDn-1. The current flowing in the RSD cell RSDn-1 corresponds to the whole current such that the logic data "0" is written in the RSD cell RSDn-1. That is, if the whole current flowing in the selecting switch N0 is a set current, a set current flows in the RSD cell RSDn-1.

When a reset state (a logic data "1") is written in the RSD cell RSDn, the bit line BLn connected to the RSD cell RSDn transitions to a high level. As a result, the switching element Nn is turned on such that the write voltage Vwrite applied through the to selecting switch N0 is applied to the RSD cell RSDn and the switching element Nn.

As a result, the write current flows while being divided in the RSD cell RSDn and the switching element Nn. The current flowing in the RSD cell RSDn is smaller than the whole current to write the is logic data "1" in the RSD cell RSDn. That is, if the whole current flowing in the selecting switch N0 is a set current, a reset current lower than the set current flows in the RSD cell RSDn.

In this way, the whole current flowing through the selecting switch N0 is the same, the larger set current flows in the RSD cells RSD1 and RSDn-1 where the set state is written, and the smaller reset current flows in the RSD cells RSD2 and RSDn where the reset state is written.

In the RSD cells RSD1~RSDn, data is simultaneously written without any increase of the write current. As a result, the write current for writing data in the cells can be reduced by 1/N in comparison with the prior art. Also, the write time for writing data in the cells can be reduced by 1/N in comparison with the prior art.

Figure 28:
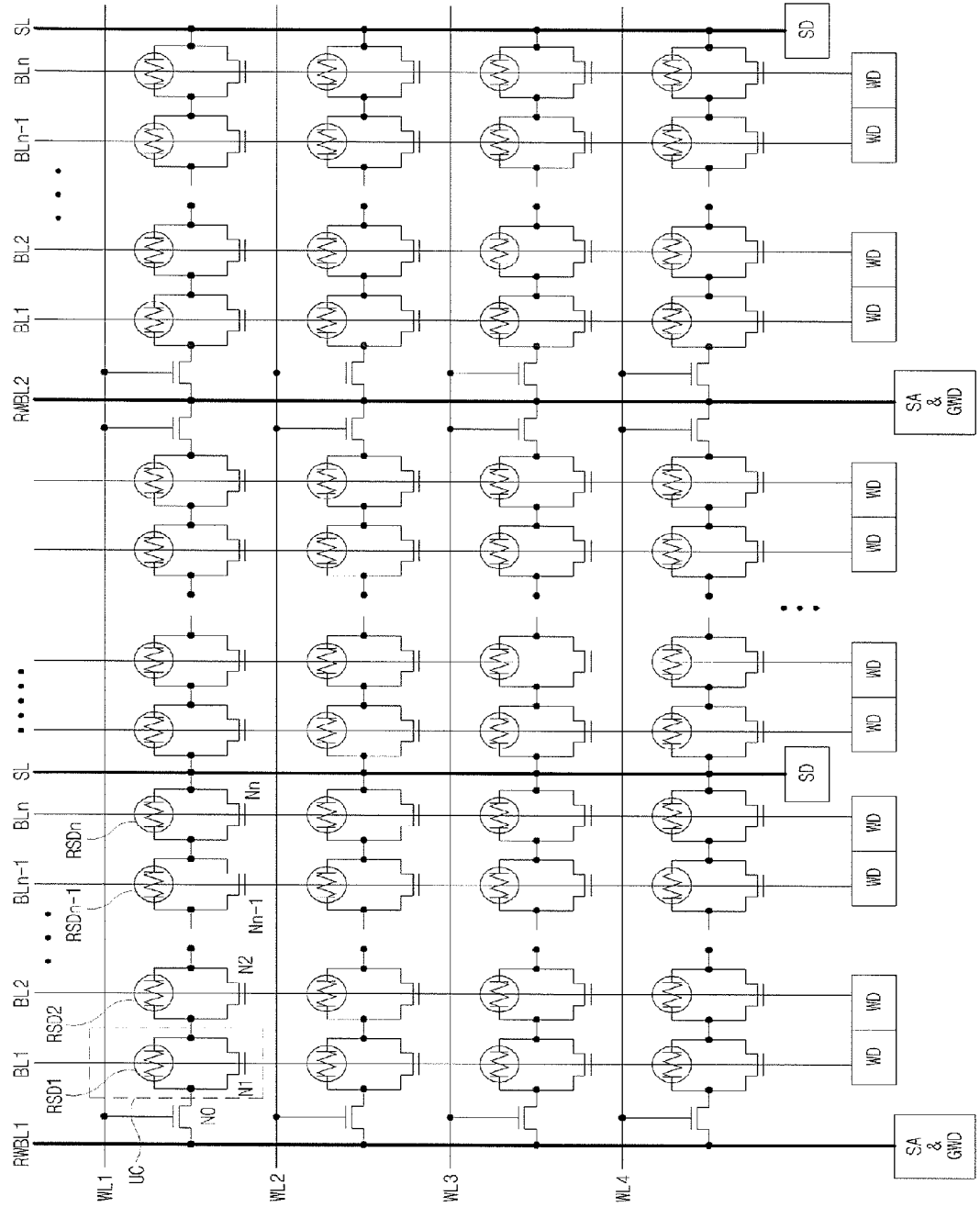
FIG. 28 is a diagram showing a cell array of the to semiconductor memory device shown in FIG. 25.

FIG. 28 is a diagram showing a cell array of the semiconductor memory device shown in FIG. 25.

The cell array includes a plurality of read/write bit lines RWBL1~RWBLn arranged in a row direction, a plurality of bit lines BL1~BLn arranged in the row direction, and a plurality of word lines WL1~WLn arranged in a column direction.

The selecting switches N0 are positioned at the intersections of the read/write bit lines RWBL1~RWBLn and the word lines WL1~WLn. The selecting switches N0 are arranged in the row and column directions.

The unit cells UC are positioned at the intersections of the bit lines BL1~BLn and the word lines WL1~WLn. The unit cells UC are arranged in the row and column directions. One read/write bit line RWBL is shared by the selecting switches N0. One source line SL is shared by the unit cells UC.

The read/write bit line RWBL is connected to a sense amplifier SA and a global write driving unit GWD. The sense amplifier SA senses and amplifies a sensing voltage Vsense applied through the read/write bit line in a read mode. The global write driving unit GWD supplies the write voltage Vwrite to the read/write bit line RWBL in the write mode.

Each bit line BL is connected to a write driving unit WD. In the read or write mode, a voltage applied to the bit line BL is selectively controlled by the voltage of the write driving unit WD to select the corresponding unit cell UC.

The source line SL is connected to the source driving unit SD. In the read or write mode, a voltage applied to the source line SL is selectively controlled by the voltage (ground voltage) of the source driving unit SD.

Figure 29:
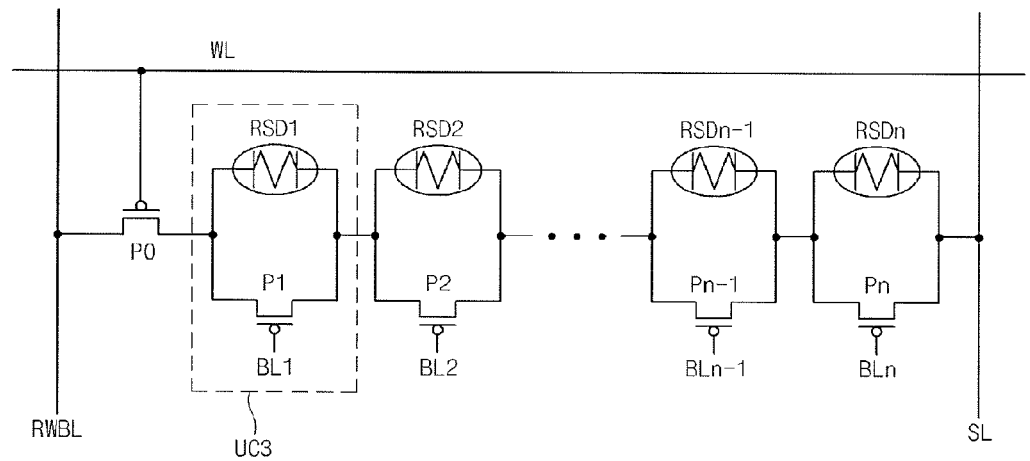
FIGS. 29 to 31 are diagrams showing examples of a semiconductor memory device according to an embodiment of the present invention.

FIG. 29 is a diagram showing a semiconductor memory device when the cell shown in FIG. 9 includes an RSD.

The semiconductor memory device of FIG. 29 comprises a selecting switch P0, a plurality of RSD cells RSD1~RSDn, and a plurality of switching elements P1~Pn.

The selecting switch P0 and the switching elements P1~Pn is include PMOS transistors. The selecting switch P0 connected between the read/write bit line RWBL and the unit cell UC3, and the gate of the selecting switch P0 is connected to the word line WL.

Each unit cell UC3 includes a RSD cell RSD1 and a switching element P1 that are connected in parallel. The RSD cell RSD1 has a first electrode connected to the drain of the switching element P1 and a second electrode connected to the source of the switching element P1. The gates of the switching elements P1~Pn are connected one by one to the bit lines BL1~BLn.

The RSD cells RSD1~RSDn are connected between the selecting switch P0 and the source line SL. That is, the drain of the switching element P1, which is connected in parallel to the RSD cell RSD1, is connected to the source of the switching element P2, which is connected in parallel to the RSD cell RSD2. Of the RSD cells RSD1~RSDn, the RSD cell RSD1 is connected to the selecting switch P0, and the final RSD cell RSDn is connected to the source line SL.

Figure 30:
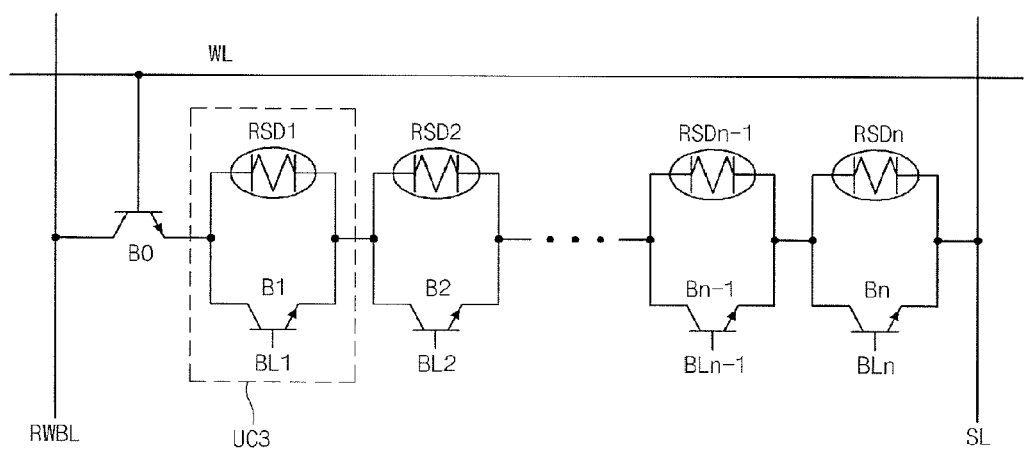

FIG. 30 is a diagram showing a semiconductor memory device when the cell shown in FIG. 9 includes a RSD.

The semiconductor memory device of FIG. 30 comprises a selecting switch B0, a plurality of RSD cells RSD1~RSDn, and a plurality of switching elements B1~Bn.

The selecting switch B0 and the switching elements B1~Bn include bipolar junction transistors (BJT). Although the selecting is switch B0 and the switching elements B1~Bn are exemplified as NPN-type BJTs, the present invention is not limited herein, but may include PNP-type BJTs.

The selecting switch B0 is connected between the read/write bit line RWBL and the unit cell UC3, and the base terminal of the selecting switch B0 is connected to the word line WL. The selecting switch B0 has a collector terminal connected to the read/write bit line RWBL and an emitter terminal connected to the unit cell UC3.

Each unit cell UC3 includes a RSD cell RSD1 and a switching element B1 that are connected in parallel. The RSD cell RSD1 has a first electrode connected to the collector terminal of the switching element B1 and a second electrode connected to the emitter terminal of the switching element B1.

The base terminals of the switching elements B1~Bn are connected one by one to the bit lines BL1~BLn. Each RSD cell has a first electrode connected to collector terminals of the switching elements B1~Bn and a second electrode connected to an emitter terminals of the switching elements B1~Bn.

The RSD cells RSD1~RSDn are connected serially between the selecting switch B0 and the source line SL. That is, the first electrode of the RSD cell RSD1 is connected to the second electrode of the adjacent RSD cell RSD2. Of the RSD cells RSD1~RSDn, the first RSD cell RSD1 is connected to the selecting switch B0, and the final RSD cell RSDn is connected to the source line SL.

Figure 31:
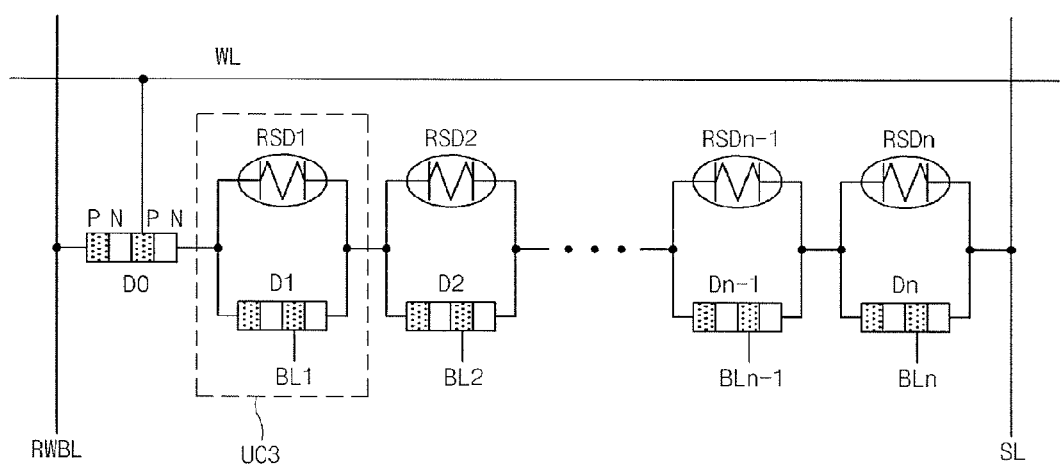

FIG. 31 is a diagram showing a semiconductor memory device when the cell shown in FIG. 9 includes a RSD.

The semiconductor memory device of FIG. 31 comprises a selecting switch D0, a plurality of RSD cells RSD1~RSDn, and a plurality of switching elements D1~Dn.

The selecting switch D0 and the switching elements D1~Dn include PNPN diode switches. Although the selecting switch D0 and the switching elements D1~Dn are exemplified as PNPN diode elements, the present invention is not limited herein, but may include NPNP diode elements.

The selecting switch D0 is connected between the read/write bit line RWBL and the unit cell UC3, and the P-type region (Base) of the selecting switch D0 is connected to the word line WL. The selecting switch D0 has a collector terminal connected to the read/write bit line RWBL and an N-type region (Emitter) connected to the unit cell UC3.

Each unit cell UC3 includes a RSD cell RSD1 and a switching element D1 that are connected in parallel. The RSD cell RSD1 has a first electrode connected to the P-type region (Collector) of the switching element D1 and a second electrode connected to the N-type region (Emitter) of the switching element D1. The switching elements D1~Dn have P-type regions (Base) connected one by one to the bit lines BL1~BLn.

The RSD cells RSD1~RSDn are connected between the selecting switch D0 and the source line SL. That is, the first electrode of the RSD cell RSD1 is connected to the second electrode of the adjacent RSD cell RSD2. Of the RSD cells RSD1~RSDn, the first RSD cell RSD1 is connected to the selecting switch D0, and the final RSD cell RSDn is connected to the source line SL.

Figure 32:
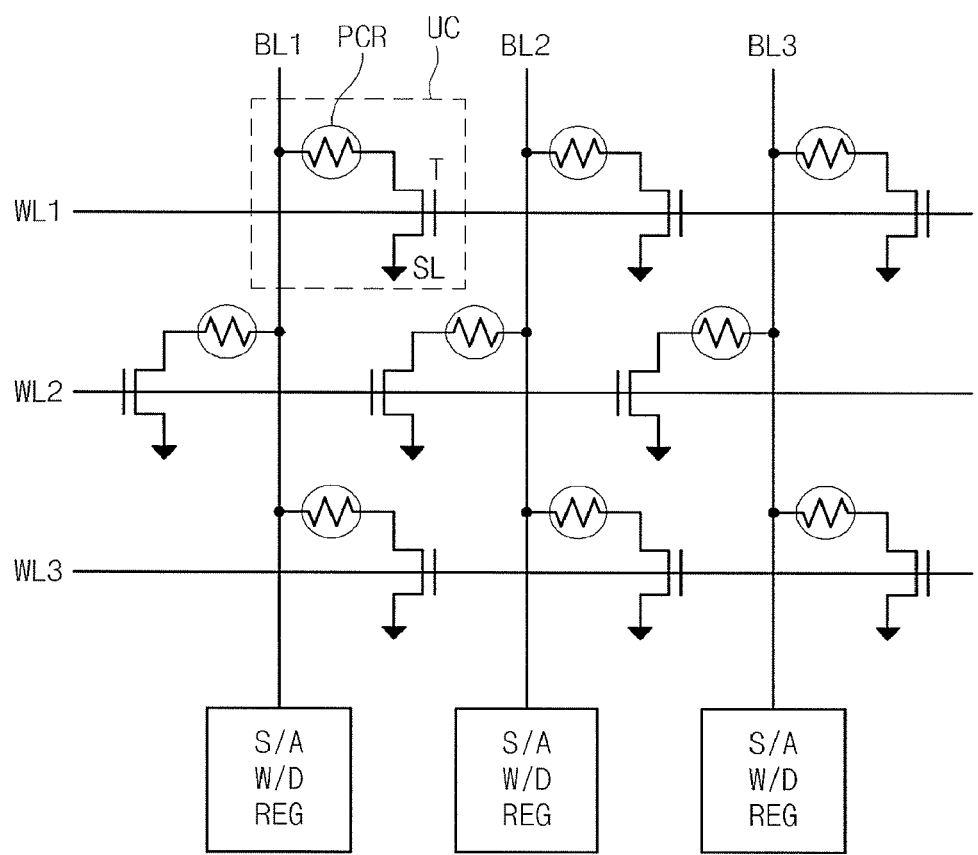
FIG. 32 is a diagram showing a memory cell array of a semiconductor memory device according to an embodiment of the present invention.

FIG. 32 is a diagram showing a memory cell array of a semiconductor memory device according to an embodiment of the present invention.

The cell array of FIG. 32 comprises a plurality of bit lines BL arranged in a row direction and a plurality of word lines WL and a plurality of source lines SL arranged in a column direction. A plurality of unit cells UC are positioned at the intersections of the word lines WL, the source lines SL, and the bit lines BL.

Each of the unit cells UC includes a switching element T and a resistor. The resistor includes an MTJ or an RSD of a ReRAM. In the embodiment as shown in FIG. 32, the resistor includes a PCR.

However, the present invention is not limited herein, but may include any resistors for distinguishing data corresponding to a resistance value changed depending on a current or a voltage.

The switching element T is switched depending on the state of the word line WL to selectively connect the phase change resistor PCR to the source line SL. The phase change resistor PCR is connected between the bit line BL and the terminal of the switching element T. The switching element T includes a NMOS transistor whose switching operation is controlled by a gate control signal.

A plurality of sense amplifiers S/A are connected one by one to the bit lines BL and the sense amplifiers S/A sense and amplify cell data applied from the bit line BL to distinguish a logic data "1" from a logic data "0".

A plurality of write driving units W/D are connected one by one to the bit lines BL. The write driving unit W/D supplies a driving voltage to the bit line BL when data is written in the memory cell. A plurality of registers REG are temporary memory devices for temporarily storing data of the sense amplifiers S/A, and are connected to the bit line BL.

Figure 33A:
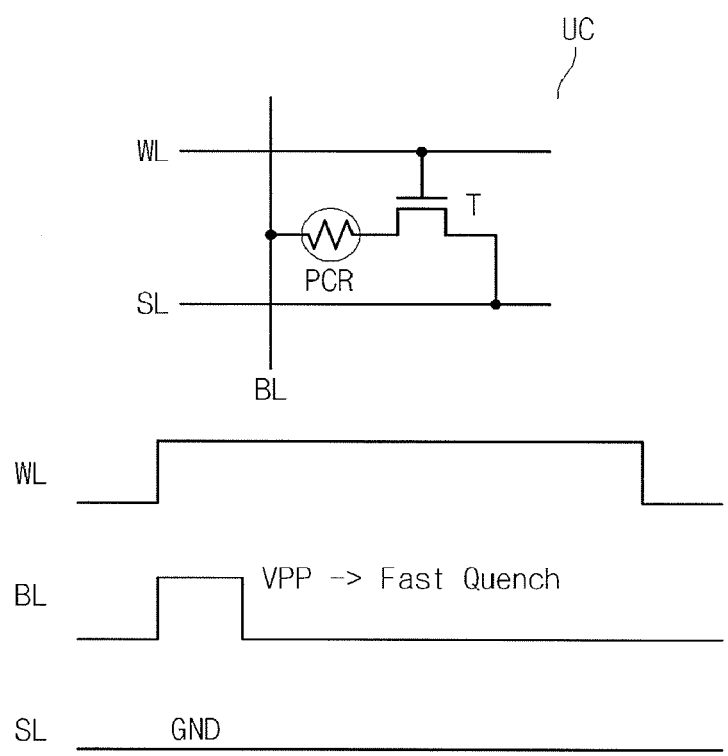
FIGS. 33a and 33b are diagrams showing the data write operation of the semiconductor memory device shown in FIG. 32.

FIG. 33a is a diagram illustrating the high data write operation of the semiconductor memory device shown in FIG. 32.

In the write mode of the logic data "1", a high voltage (power voltage or pumping voltage), which is a cell activating voltage, is applied to the word line WL, a pumping voltage VPP, which is a reset write voltage, is applied to the bit line BL, and a ground voltage GND is applied to the source line SL.

The switching element T is turned on by the high voltage applied to the word line WL to connect the phase change resistor PCR to the source line SL. When a voltage of the bit line BL is higher than that of the source line SL, the phase change resistor PCR is at a reset state depending on the pumping voltage VPP applied to is the bit line BL.

Figure 33B:
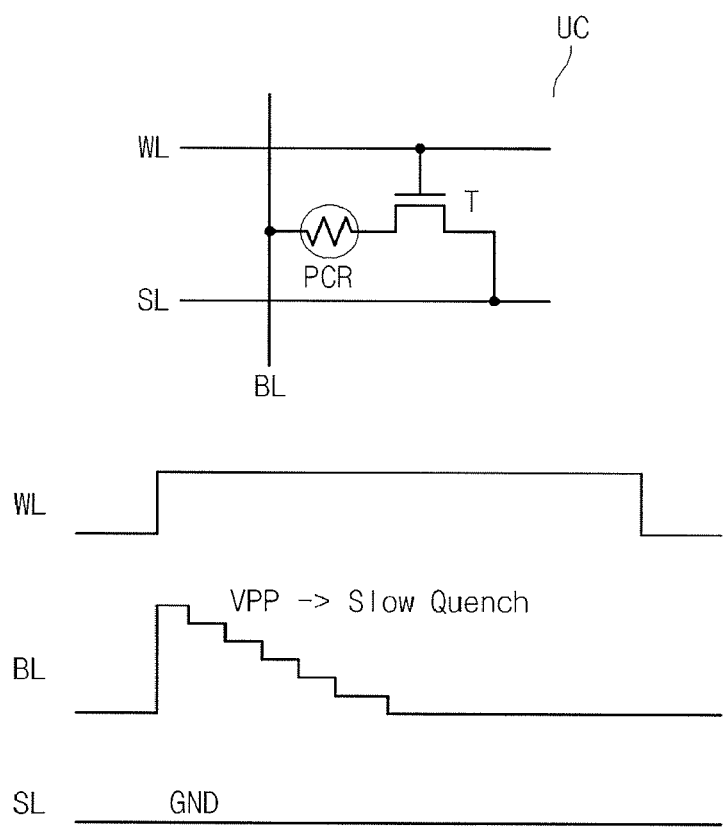

FIG. 33b is a diagram illustrating the low data write operation of the semiconductor memory device shown in FIG. 32.

In the write mode of the logic data "0", a high voltage (power voltage or pumping voltage) is applied to the word line WL, and a ground voltage GND is applied to the source line SL. A set write voltage, having a level that becomes progressively lower step by step from the level of the pumping voltage VPP, is applied to the bit line BL.

The switching element T is turned on by the high voltage applied to the word line WL to connect the phase change resistor PCR to the source line SL. The phase change resistor PCR is at a set state depending on the set write voltage having a pulse that becomes progressively lower step by step. As a result, the logic data "0" can be stored in the phase change resistor PCR.

Figure 34:
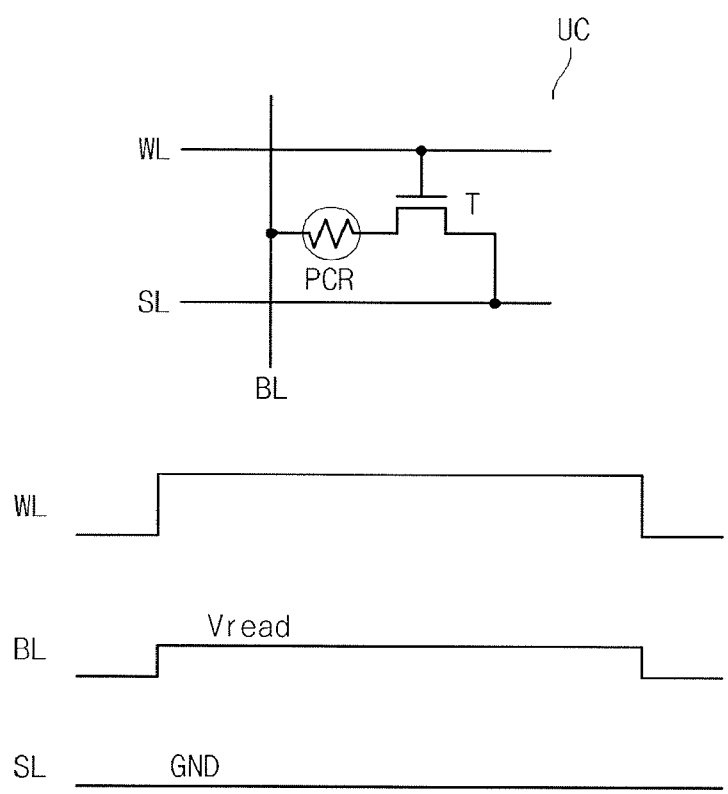
FIG. 34 is a diagram showing the data read operation of the semiconductor memory device shown in FIG. 32.

FIG. 34 is a diagram illustrating the data read operation of the semiconductor memory device shown in FIG. 32.

In the read mode, a high voltage (power voltage or pumping voltage) is applied to the word line WL, a read voltage Vread is applied to the bit line BL, and a ground voltage GND is applied to the source line SL.

In this case, the switching element T is turned by the high voltage applied to the word line WL, which connects the phase change resistor PCR to the source line SL. As a result, the logic data "0" or "1" stored in the phase change resistor PCR can be sensed.

Figure 35A:
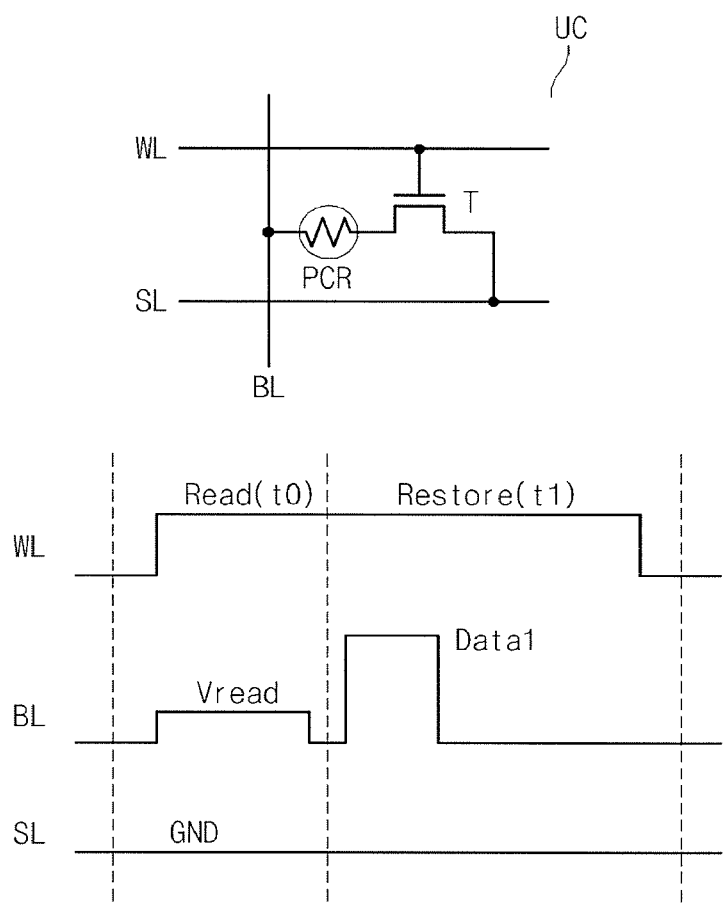
FIGS. 35a and 35b are diagrams showing the data refresh operation of the semiconductor memory device shown in FIG. 32.

FIG. 35a is a diagram illustrating the high data refresh operation of the semiconductor memory device shown in FIG. 32.

In the refresh mode of the logic data "1", during a read period t0 a high voltage (power voltage or pumping voltage) is applied to the word line WL, a read voltage Vread is applied to the bit line BL, and a ground voltage GND is applied to the source line SL.

In this case, the switching element T is turned on by the high voltage applied to the word line WL to connect the phase change resistor PCR to the source line SL. As a result, the logic data "1" stored in the phase change resistor PCR can be sensed.

In a restoring period t1, the high voltage (power voltage or pumping voltage) is applied to the word line WL, a pumping voltage VPP for writing the logic data "1" is applied to the bit line BL, and the ground voltage GND is applied to the source line SL.

In this case, the switching element T is turned on by the high voltage applied to the word line WL to connect the phase change resistor PCR to the source line SL. When the voltage of the bit line BL is higher than that of the source line SL, the phase change resistor PCR is at a reset state depending on the pumping voltage VPP applied to the bit line BL. As a result, the logic data "1" can be is restored in the phase change resistor PCR.

Figure 35B:
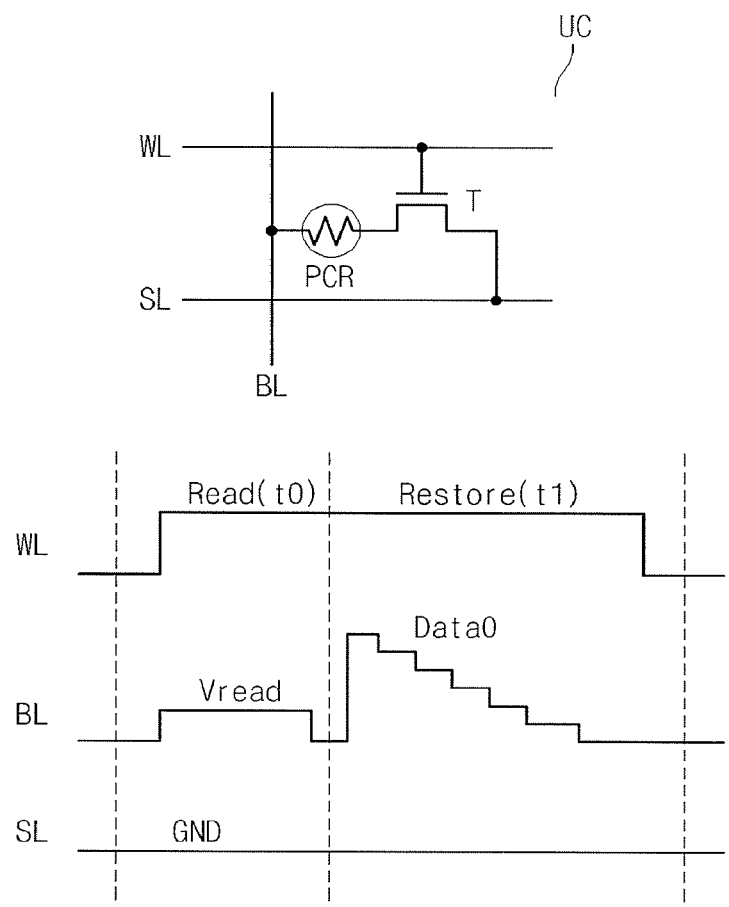

FIG. 35b is a diagram illustrating the low data refresh operation of the semiconductor memory device shown in FIG. 32.

In the refresh mode of the logic data "0", during a read period t0, a high voltage (power voltage or pumping voltage)

is applied to the word line WL, a read voltage Vread is applied to the bit line BL, and a ground voltage GND is applied to the source line SL.

In this case, the switching element T is turned on by the high voltage applied to the word line WL to connect the phase change resistor PCR to the source line SL. As a result, the logic data "0" stored in the phase change resistor PCR can be sensed.

In a restoring period t1, the high voltage (power voltage or pumping voltage) is applied to the word line WL, a set write voltage, having a level that becomes progressively lower step by step from the level of the pumping voltage VPP, is applied to the bit line BL, and the ground voltage GND is applied to the source line SL.

In this case, the switching element T is turned on by the high voltage applied to the word line WL to connect the phase change resistor PCR to the source line SL. The phase change resistor PCR is at a set state depending on the set write voltage having a pulse that becomes progressively lower. As a result, the logic data "0" can be restored in the phase change resistor PCR.

Figure 36:
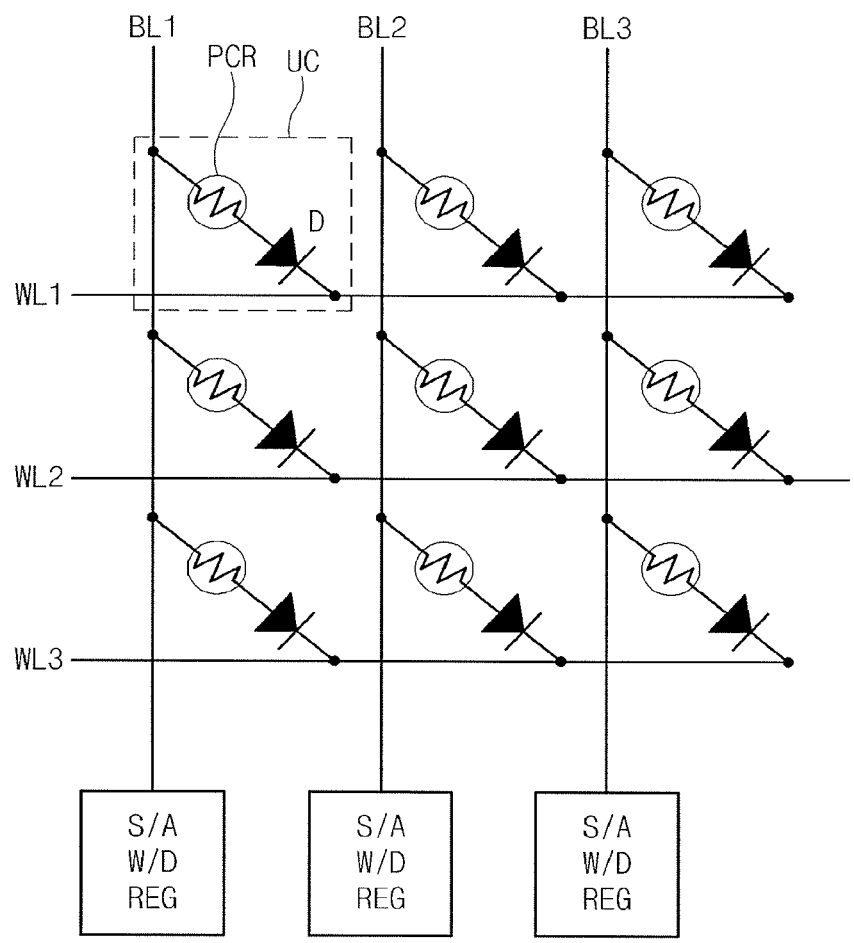
FIG. 36 is a diagram showing a cell array of a semiconductor memory device according to another embodiment of the present invention.

FIG. 36 is a diagram showing a cell array of a semiconductor memory device according to another embodiment of the present invention.

The cell array of FIG. 36 includes a plurality of bit lines BL arranged in a row direction and a plurality of word lines WL arranged in a column direction. A plurality of unit cells UC are positioned at the intersections of the bit lines BL and the word lines WL.

The unit cell UC includes a phase change resistor PCR and a diode D. The diode D includes a PN diode element. A first electrode of the phase change resistor PCR is connected to the bit line BL, and a second electrode of the phase change resistor PCR is connected to the P-type region of the diode D. The N-type region of the diode D is connected to the word line WL. When writing data, the phase of the phase change resistor PCR changes depending on which current is flowing in the bit line BL, the set current Iset or the reset current Ireset.

A plurality of sense amplifiers S/A are connected one by one to the bit lines BL, and sense cell data is applied from the bit lines BL to distinguish a logic data "1" from a logic data "0".

A plurality of write driving units W/D are connected one by one to the bit lines BL. When writing data, the write driving unit W/D supplies a driving voltage corresponding to write data to the bit line BL. A register REG is a temporary memory device for temporarily storing data of the sense amplifier S/A, and a register REG is connected to each bit line BL.

Figure 37A:
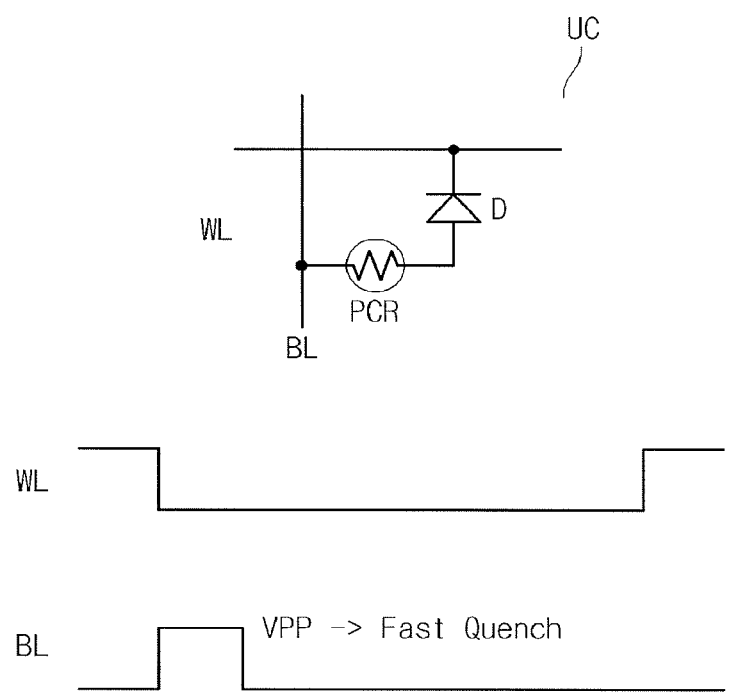
FIGS. 37a and 37b are diagrams showing the data write operation of the semiconductor memory device shown in FIG. 36.

FIG. 37a is a diagram illustrating the high data write operation of the semiconductor memory device shown in FIG. 36.

In the write mode of the logic data "1", a low voltage (ground voltage) is applied to the word line WL, and a pumping voltage VPP is applied to the bit line BL.

In this case, a current path between the diode D and the phase change resistor PCR is formed depending on the low voltage applied to the word line WL. The phase change resistor PCR is at a reset state depending on the pumping voltage VPP applied to the bit line BL. As a result, the logic data "1" can be stored in the phase change resistor PCR.

Figure 37B:
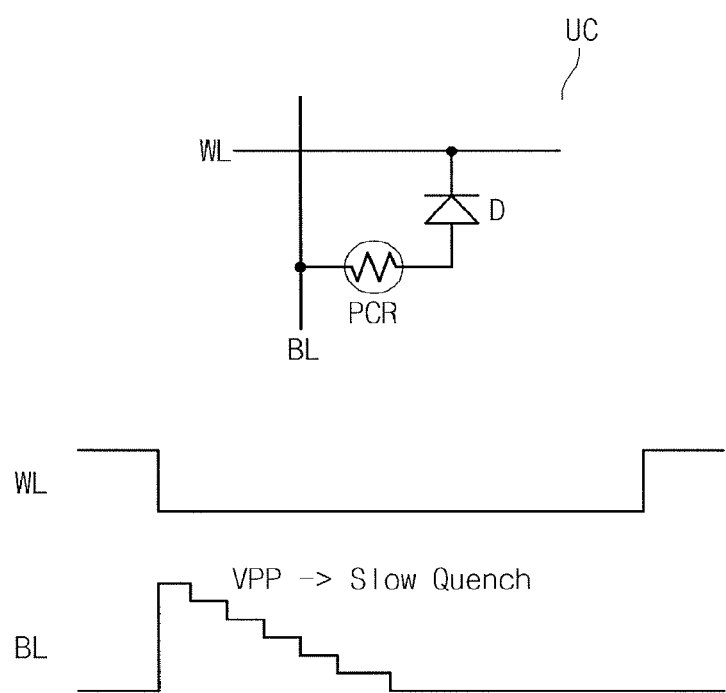

FIG. 37b is a diagram illustrating the low data write operation of the semiconductor memory device shown in FIG. 36.

In the write mode of the logic data "0", a low voltage (ground voltage) is applied to the word line WL, and a set write voltage, having a level that becomes progressively lower step by step from the level of the pumping voltage VPP, is applied to the bit line BL.

In this case, the current path between the diode D and the phase change resistor PCR is formed depending on the low voltage applied to the word line WL. The phase change resistor PCR is at a set state depending on the set write voltage having a pulse that becomes progressively lower. As a result, the logic data "0" can be stored in the phase change resistor PCR.

Figure 38:
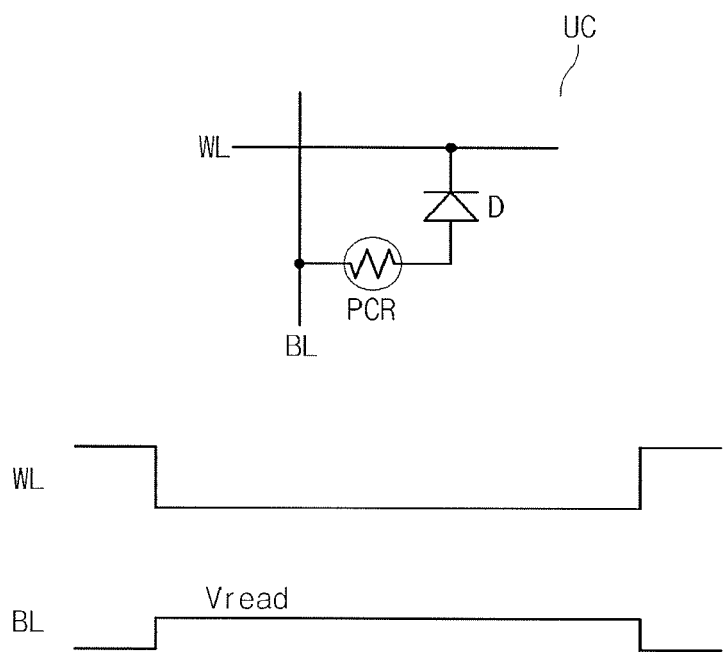
FIG. 38 is a diagram showing the data read operation of the semiconductor memory device shown in FIG. 36.

FIG. 38 is a diagram illustrating the data read operation of the semiconductor memory device shown in FIG. 36.

In the read mode of data, a low voltage (ground voltage) is applied to the word line WL, and a read voltage Vread is applied to the bit line BL.

In this case, the current path between the diode D and the phase change resistor PCR is formed depending on the low voltage applied to the word line WL. As a result, the logic data "0" or "1" stored in the phase change resistor PCR can be sensed.

Figure 39A:
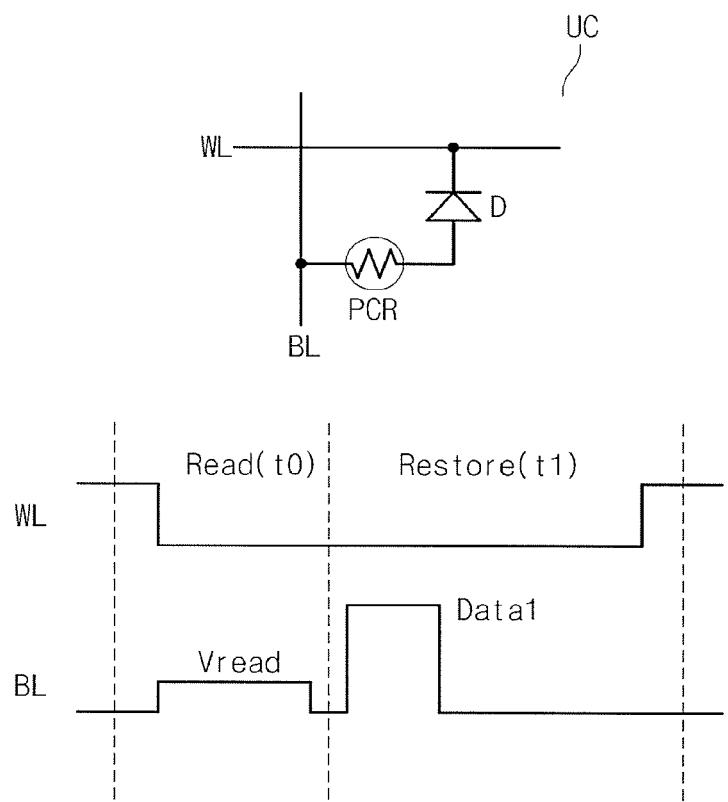
FIGS. 39a and 39b are diagrams showing the data refresh operation of the semiconductor memory device shown in FIG. 36.

FIG. 39a is a diagram illustrating the high data refresh operation of the semiconductor memory device shown in FIG. 36.

In the refresh mode of the logic data "1", during a read period t0, a low voltage (ground voltage) is applied to the word line WL, and a read voltage Vread is applied to the bit line BL.

In this case, a current path between the diode D and the phase change resistor PCR is formed when the low voltage is applied to the word line WL. As a result, the logic data "1" stored in the phase change resistor PCR can be sensed.

In a restoring period t1, the low voltage (ground voltage) is applied to the word line WL, and a pumping voltage VPP, for writing the logic data "1", is applied to the bit line BL.

In this case, a current path between the diode D and the phase change resistor PCR is formed depending on the low voltage applied to the word line WL. The phase change resistor PCR is at a reset state depending on the pumping voltage VPP applied to the bit line BL. As a result, the logic data "1" can be restored in the phase change resistor PCR.

Figure 39B:
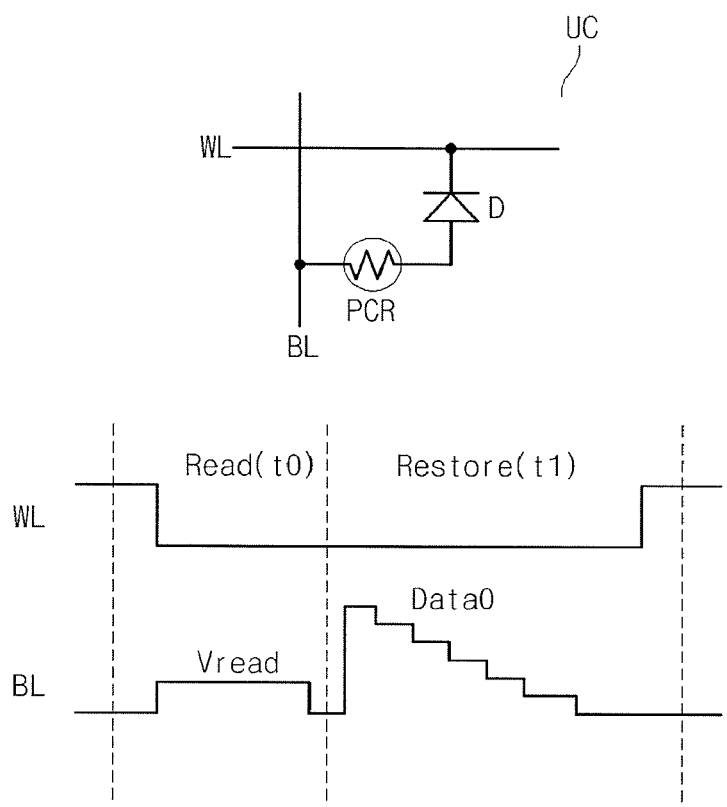

FIG. 39b is a diagram illustrating the low data refresh operation of the semiconductor memory device shown in FIG. 36.

In the refresh mode of the logic data "0", during a read period t0, a low voltage (ground voltage) is applied to the word line WL, and a read voltage Vread is applied to the bit line BL.

In this case, a current path between the diode D and the phase change resistor PCR is formed depending on the low voltage applied to the word line WL. As a result, the logic data "0" stored in the phase change resistor PCR can be sensed.

In a restoring period t1, the low voltage (ground voltage) is applied to the word line WL, and a set write voltage, which is progressively decreased by the pumping voltage VPP level, is applied to the bit line BL.

In this case, the current path between the diode D and the phase change resistor PCR is formed depending on the low voltage applied to the word line WL. The phase change resistor PCR is at a set state depending on the set write voltage having a pulse that becomes lower step by step. As a result, the logic data "0" can be restored in the phase change resistor PCR.

Figure 40:
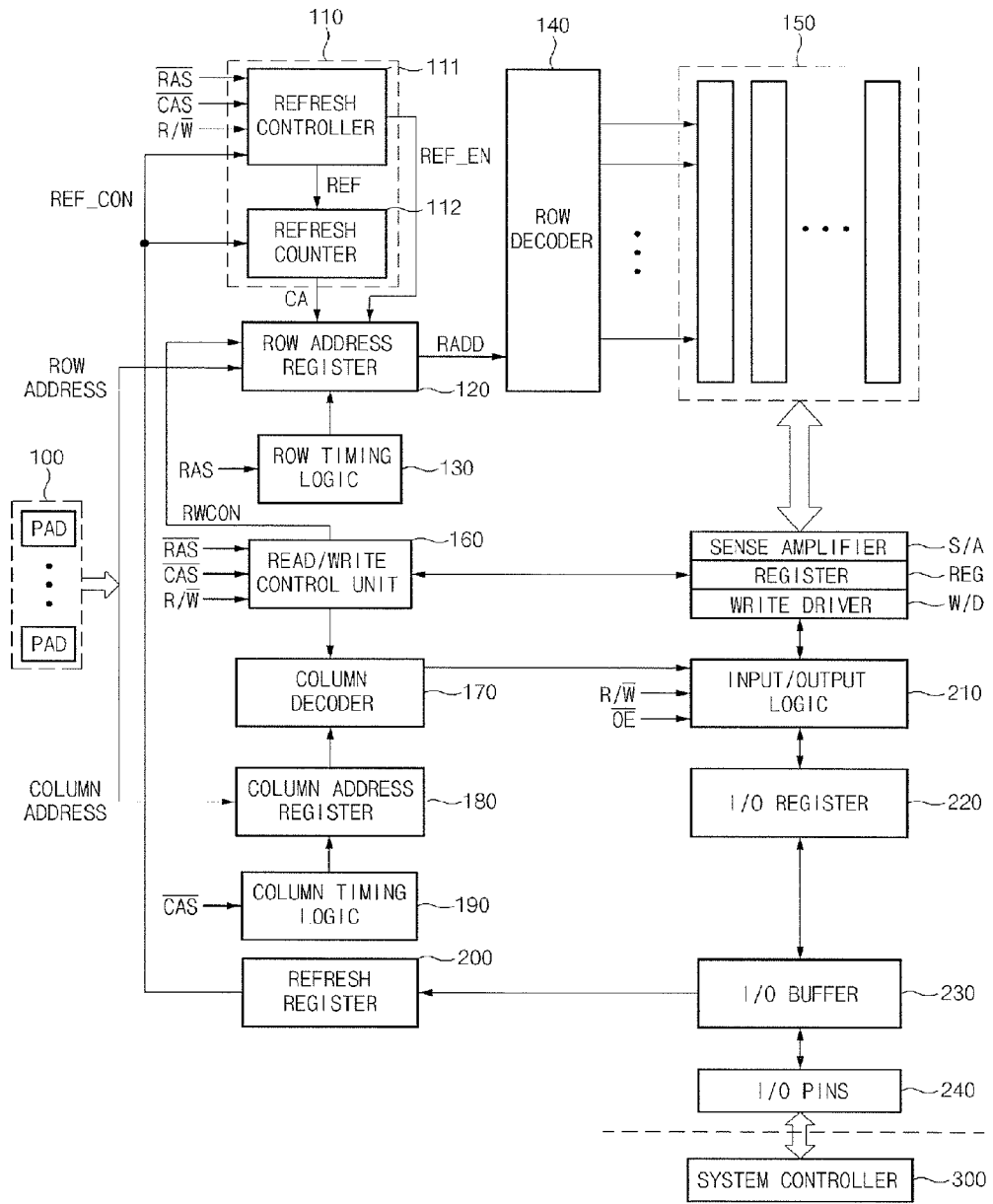
FIG. 40 is a diagram showing a semiconductor memory device according to an embodiment of the present invention.

FIG. 40 is a diagram showing a semiconductor memory device according to an embodiment of the present invention.

The semiconductor memory device of FIG. 40 comprises a pad array 100, a refresh control unit 110, a row address register 120, a row timing logic 130, a row decoder 140, a cell array 150, a read/write control unit 160, a column decoder 170, a column address register 180, a column timing logic 190, a refresh register 200, a sense amplifier S/A, a register REG, a write driving unit W/D, an input/output logic unit 210, an I/O register 220, an I/O buffer 230, and I/O pins 240.

The refresh control unit 110 includes a refresh controller 111 and a refresh counter 112. The cell array 150 includes a plurality of phase change resistance cells.

The pad array 100 includes a plurality of pads PAD, and receives a row address and a column address through a pad to output the addresses with a time difference. The refresh controller 111 receives a Row Address Strobe (RAS) signal /RAS, a Row Address Strobe (CAS) signal /CAS, and a read/write command R/W; and the refresh controller outputs a refresh signal REF, for controlling the refresh operation in response to a refresh control signal REF_CON, and a refresh enable signal REF_EN. The refresh counter 112 counts a refresh cycle in response to the refresh signal REF applied from the refresh controller 111 and the refresh control signal REF_CON applied from the refresh register 200 to output a count address CA.

The row address register 120 temporarily stores a row address applied from the pad array unit 100. The row address register 120 outputs a row address RADD activated in response to an output signal of the row timing logic 130 and a read/write control signal RWCON applied from the read/write control unit 160 to the row decoder 140. The row timing logic 130 controls the storing operation and address output timing of the row address register 120. The row decoder 140 decodes the row address RADD applied from the row address register 120 to output the address to the cell array 150.

The read/write control unit 160 outputs the read/write control signal RWCON for controlling the read/write operation to the row address register 120 in response to the RAS signal /RAS, the case signal /CAS and the read/write command R/W, and controls the column decoder 170, the sense amplifier S/A, the register REG and the write driving unit W/D.

The column decoder 170 decodes a column address received to from the column address register 180 according to the read/write control unit 160 to output the column address to the input/output logic unit 210. The column address register 180 temporarily stores the column address received from the pad array 100 to output the column address to the column decoder 170 according to the column is timing logic 190.

The column timing logic 190 controls the storing operation and address output timing of the column address register 180 in response to the CAS signal /CAS. The column address register 180 supplies refresh data to the memory cell according to the column timing logic 190 in activation of the refresh signal REF.

The refresh register 200 is a nonvolatile register for storing a parameter related to the refresh operation. The refresh register 200 stores refresh counter information, information on power-off time of the system or internal memory, and other parameter information, and outputs the refresh control signal REF_CON, which is based on the parameter information in the refresh operation.

The sense amplifier S/A senses and amplifies cell data to distinguish a logic data "1" from a logic data "0". When writing data in the memory cell, the write driving unit W/D generates a driving voltage depending on write data to supply the data to the bit line. The register REG temporarily stores data sensed in the sense amplifier S/A to restore the data in the memory cell during the write operation.

The input/output logic unit 210 reads data stored in the cell array 150 in response to an output signal of the column decoder 170 and the read/write command R/W to store data in the cell array 150. The input/output logic unit 210 includes a column selecting signal C/S. The input/output logic unit 210 outputs data stored in the cell array 150 to the I/O register 220 in response to an output enable signal /OE.

The I/O buffer 230 buffers read data stored in the I/O register 220 and write the data applied from the I/O pins 240 according to the refresh register 200. The I/O pins 240 output data received from the I/O buffer 230 to a system controller through a data bus, and also output data applied through the data bus from the system controller 300 to the I/O buffer 230.

Figure 41:
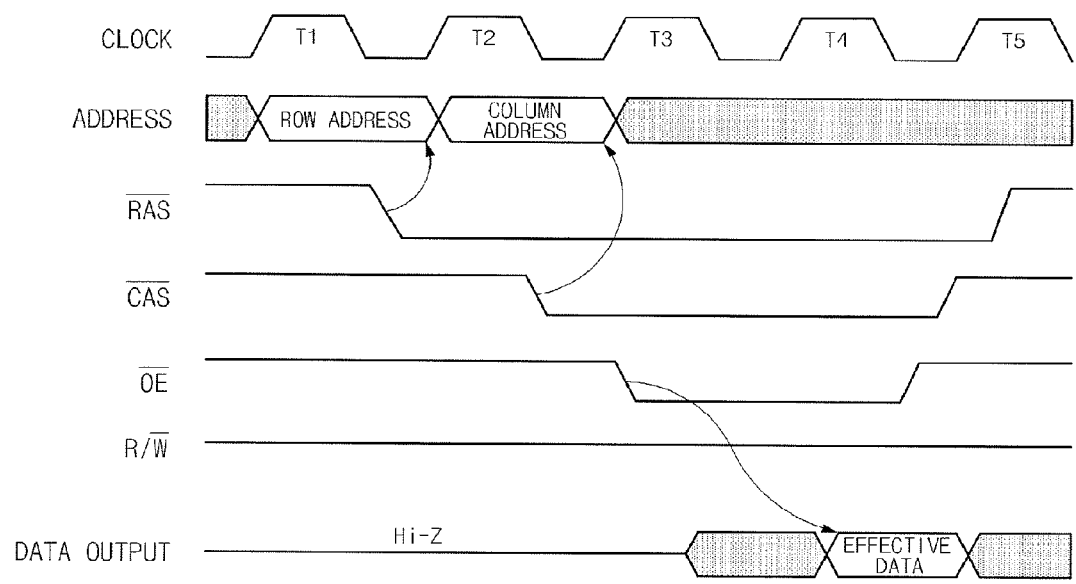
FIG. 41 is a timing diagram showing the read operation of the semiconductor memory device shown in FIG. 40.
Figure 42:
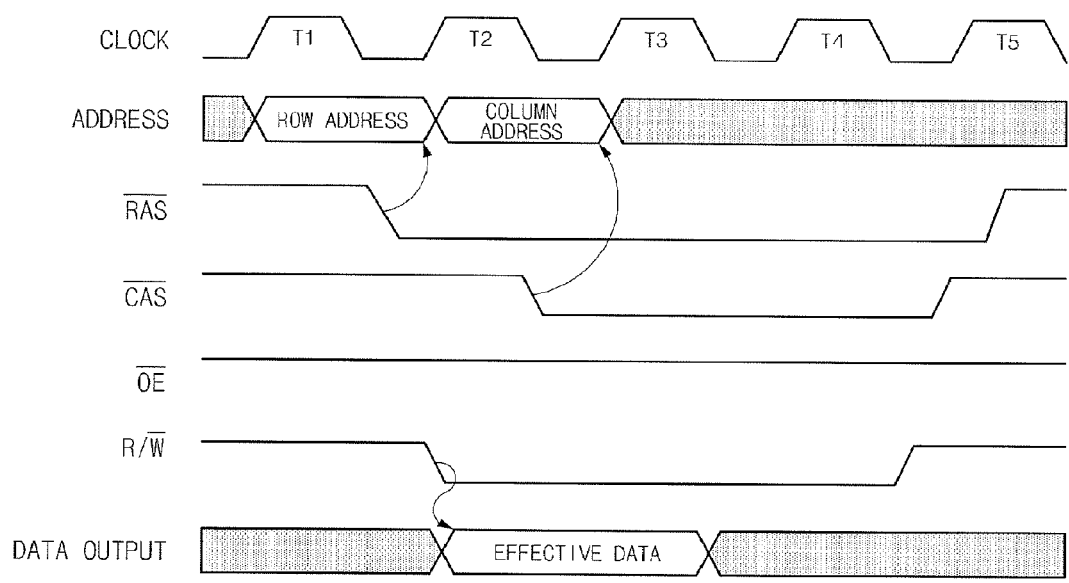
FIG. 42 is a timing diagram showing the write operation of the semiconductor memory device shown in FIG. 40.

FIG. 41 is a timing diagram illustrating the read operation of the semiconductor memory device shown in FIG. 40, and FIG. 42 is a timing diagram illustrating the write operation of the semiconductor memory device shown in FIG. 40.

Referring to FIGS. 41 and 42, the operations of the semiconductor memory device are described below.

The pad array 100 receives the row address and the column address through the pads PAD and outputs the addresses to the row address register 120 and the column address register 180. The row address register 120 and the column address register 180 output the row address and the column address with a time difference by timing multiplexing according to the row timing logic 130 and the column timing logic 190.

As shown in FIGS. 41 and 42, the row address register 120 temporarily stores the row address in synchronization with the RAS signal /RAS to output the row address RADD to the row decoder 140. When the row address RADD is outputted, the column address register 180 temporarily stores the column address.

Similarly, the column address register 180 temporarily stores the column address in synchronization with the CAS signal /CAS to output the column address to the column decoder 170. When the column address is outputted, the row address register 120 temporarily stores the row address.

In the read mode, when the output enable signal /OE and the read command R are both activated, data stored in the cell array 150 is outputted to the I/O register 220 according to the input/output logic unit 210. In the write mode, when the output enable signal /OE is inactivated while the write command /W is activated, the cell array stores data in the cell array 150 according to the input/output logic unit 210.

Figure 43:
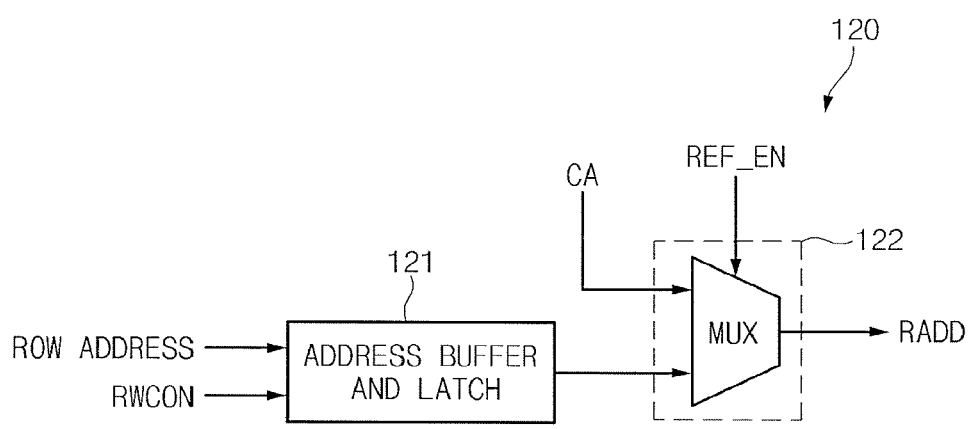
FIG. 43 is a diagram showing a row address register of FIG. 40.

FIG. 43 is a circuit diagram showing the row address register 120 of FIG. 40.

The row address register 120 includes an address buffer and latch 121 and a selecting unit 122. The selecting unit 122 includes a multiplexer MUX.

The address buffer and latch 121 both buffers and latches the row address applied from the pad array 100 in response to the read/write control signal RWCON applied from the read/write control unit 160. The selecting unit 122 selects either the count address CA, applied from the refresh counter 112, or output signals of the address buffer and latch 121 depending on the activation state of the refresh enable signal REF_EN applied from the refresh controller 111 to output the row address RADD to the row decoder 140.

That is, in the normal mode, the row address register 120 selects the row address applied from the pad array 100 to output the row address to the row decoder 140. In the refresh mode, the row address register 120 selects the count address CA applied from the refresh counter 112 to output the count address CA to the row decoder 140 in response to the refresh enable signal REF_EN.

Figure 44:
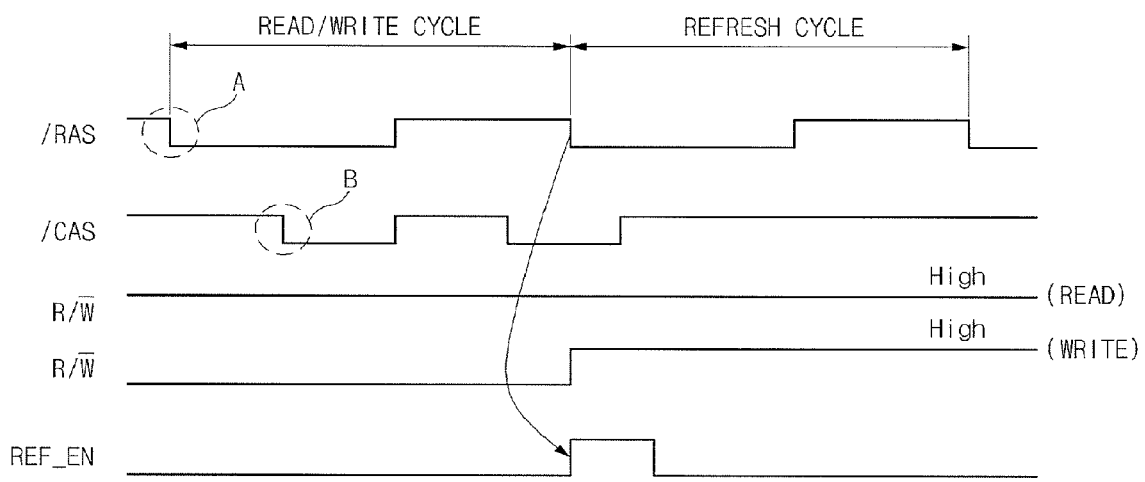
FIG. 44 is a timing diagram showing a refresh method of the semiconductor memory device shown in FIG. 40.

FIG. 44 is a timing diagram illustrating a refresh method of the semiconductor memory device shown in FIG. 40.

When a refresh operation command is applied depending on the combination of the RAS signal /RAS, the CAS signal /CAS, the read/write command R/W, and the refresh control signal REF_CON, the refresh controller 111 outputs the refresh signal REF, for performing a refresh operation to the refresh counter 112, and outputs the refresh enable signal REF_EN to the row address register 120. The refresh counter 112 counts the refresh cycle in response to the refresh signal REF and the refresh control signal REF_CON applied from the refresh controller 111 to output the count address CA to the row address register 120.

The count address CA is outputted from the refresh counter 112 and is stored in the row address register 120. The column timing logic 190 outputs data stored in the column address register 180 to the column decoder 170 in response to the CAS signal /CAS. The refresh data stored in the register REG through the input/output logic unit 210 is written in the cell array 150 while the sense amplifier S/A is activated.

The refresh signal REF may be the RAS signal /RAS and the CAS signal /CAS. That is, when the refresh signal REF is a control signal using the RAS signal /RAS and the CAS signal /CAS, the refresh operation is performed by a CAS before RAS (/CBR) system.

For example, in the normal mode for performing the read or write operation, the RAS signal /RAS is activated earlier than the CAS signal /CAS so that the normal operation is performed depending on the row timing logic 130 and the column timing logic 190. That is, as shown in (A), if the RAS signal /RAS is activated prior to the activation of the CAS signal /CAS, an external row address is activated to activate the sense amplifier S/A. As shown in (B), if the CAS signal /CAS is activated, an external column address is activated.

In the refresh mode, the refresh controller 111 senses that the CAS signal /CAS is activated earlier than the RAS signal /RAS to activate the refresh signal REF. That is, if the refresh controller 111 senses that the CAS signal /CAS is activated prior to the activation of the RAS signal /RAS, the refresh mode is determined to activate the refresh enable signal REF_EN.

When the refresh enable signal REF_EN is activated, the row address register 120 performs the refresh operation in response to the generated count address CA according to the refresh counter 112 while the normal mode path is disconnected. The row address register 120 senses that the CAS signal /CAS is simultaneously transitioned to the active state with the RAS signal /RAS to activate the refresh signal REF.

Although the refresh system using the /CBR system is exemplified in the embodiment, the present invention is not limited herein, but the refresh operation may be performed by various systems using a self-refresh, an auto-refresh, or a clock.

That is, in the refresh mode, the word line WL of the cell array 150 is selected in response to the count address CA. As a result, the data of corresponding cells having a 1T (transistor) structure in the cell array 150 is sensed, amplified, and stored in the sense amplifier register REG. New data is written in the cell array 150 or the data stored in the register REG is restored in the cell array 150.

Figure 45:
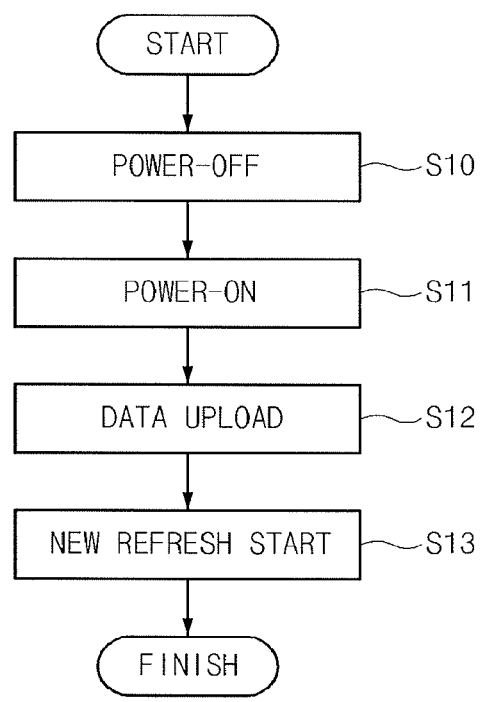
FIGS. 45 and 46 are flow charts showing the refresh method of the semiconductor memory device shown in FIG. 40.
Figure 46:
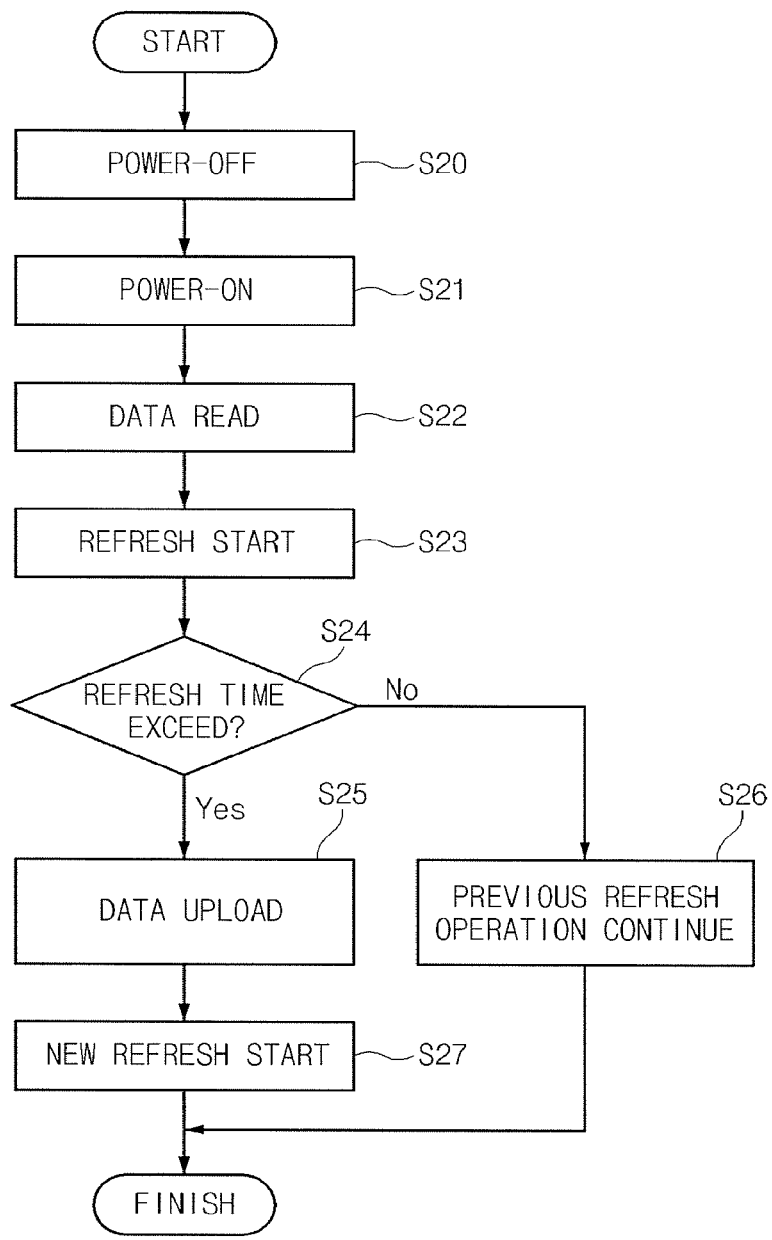

FIGS. 45 and 46 are flow charts showing the refresh method of the semiconductor memory device shown in FIG. 40.

When the power is turned on (S11) while a system power of the DRAM, a volatile memory, is turned off (S10), data of the memory are uploaded (S12) so that a new refresh operation starts (S13). That is, when the system power is turned on, the data of the memory are must be uploaded.

However, in the nonvolatile ferroelectric memory device of the embodiment of the present invention, when the power is turned on (S21) while the system power is turned off (S20), data is read to decide which data is stored in the phase change resistor PCR (S22). When the refresh operation starts (523), the refresh register 200 determines whether the refresh time is exceeded (S24).

When the refresh time is exceeded, data of the memory are uploaded (S25) and a new refresh operation starts (S27).

On the other hand, when the refresh time is not exceeded, the previous refresh operation continues (S26). As a result, the data read in the phase change resistor PCR is restored in the memory cell array.

The refresh register 200 stores parameter information related to the refresh operation in a nonvolatile register. The refresh register 200 stores refresh count information, power-off timing information of the system or internal memories, and other nonvolatile parameter information. In the refresh register 200, an additional power to sensing unit (not shown) senses the on/off states of the system or the internal memory.

When the power is off, data stored in the refresh register 200 is read to calculate the refresh passing time. The refresh passing time can be stored in a mode register set (MRS) and controlled in a system level.

The refresh passing time calculated in response to the refresh control signal REF_CON is transmitted to the refresh controller 111 in response to the refresh control signal REF_CON. As a result, in this embodiment of the present invention, it is unnecessary to upload the refresh related information even when the power is on.

Figure 47:
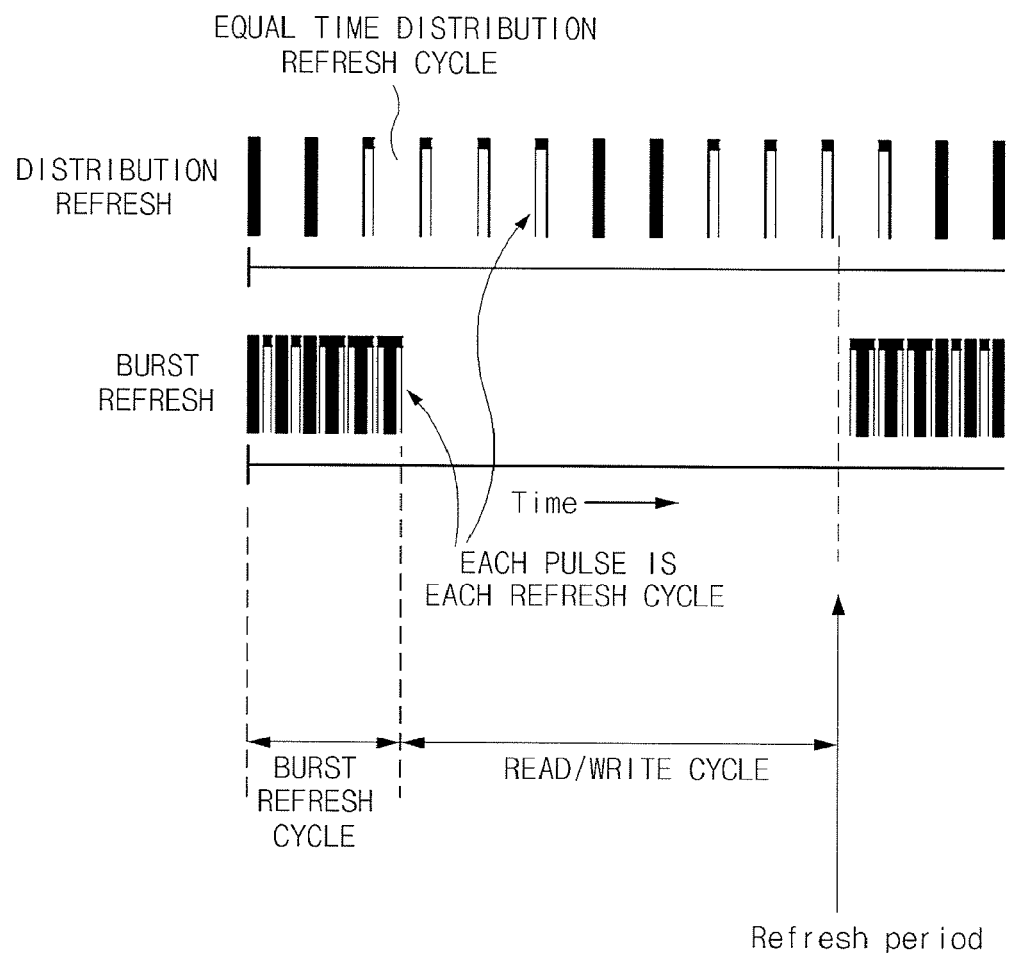
FIG. 47 is a diagram showing the refresh method of the semiconductor memory device shown in FIG. 40.

FIG. 47 is a diagram showing the refresh method of the semiconductor memory device shown in FIG. 40.

In the distributed refresh method, the refresh operation is performed with the same time distribution such that all cells may be refreshed within the refresh time in response to count address CA counted in the refresh counter 112. That is, when 8 k rows are refreshed, each distributed refresh operation cycle is represented by (refresh time)/8 k. As a result, the cell becomes initialized only when data is written in all word lines WL.

In the burst refresh method, 8 k refresh cycles are continuously performed within a burst refresh cycle time. Each pulse means each refresh cycle, and a normal operation is performed in the read/write operation cycle periods where the pulse is inactivated.

Figure 48:
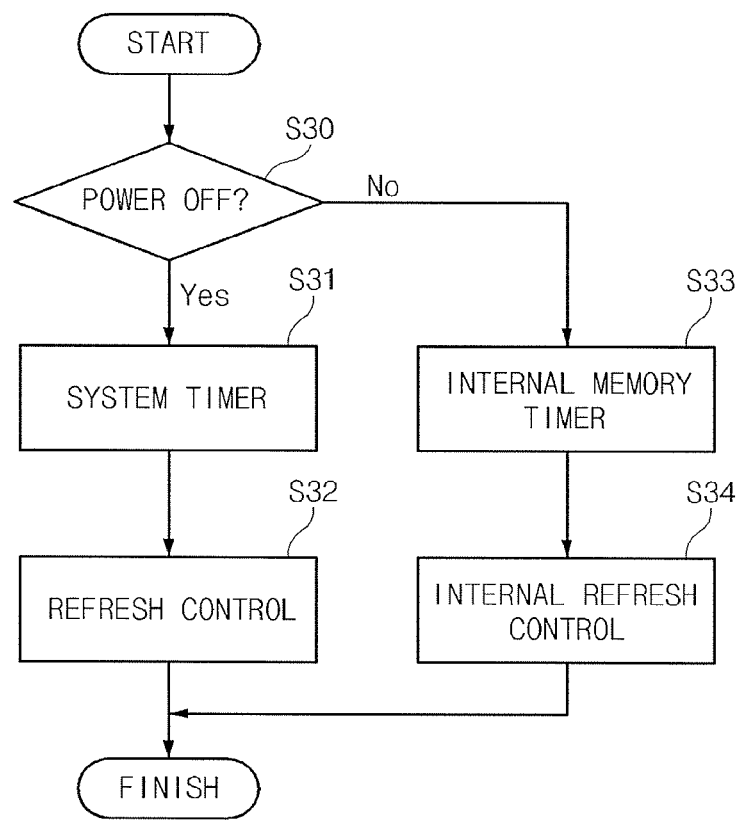
FIG. 48 is a diagram showing the timing control operation of the refresh method of the semiconductor memory device shown in FIG. 40.

FIG. 48 is a diagram showing the timing control operation of the refresh method of the semiconductor memory device shown in FIG. 40.

The refresh register 200 identifies whether the system power is off and stores the result (S30). When the power is off, a system is timer within the system is used (S31) while an internal memory timer is off such that the refresh operation is controlled (S32). The system timer stores a date and a time powered with a battery during a time when the power source is required to be on continuously.

When the power is not off, the internal memory timer operated individually is used (S33) such that the internal refresh operation is controlled (S34).

Either the external system timer or the internal memory timer is selected depending on on/off states of the power through the input/output data pins 240. That is, the refresh register 200 of the memory device, including the memory timer, exchanges data with the data buses through the I/O buffer 230 and the I/O pins 240. The system CPU, including the system timers, exchanges data with the memory device through the data buses.

When the power is off the refresh operation is performed with the external system timer, whose power is continuously on, through data exchange between the memory device and the system controller 300. When the power is on, the refresh operation is performed with the internal memory timer.

As a result, the refresh period and the memory data are effectively maintained regardless of the power on/off state of the memory chip. Between the refresh periods, the memory chip power is turned off to reduce power consumption, and power is supplied to the chip only in the refresh period.

Figure 49:
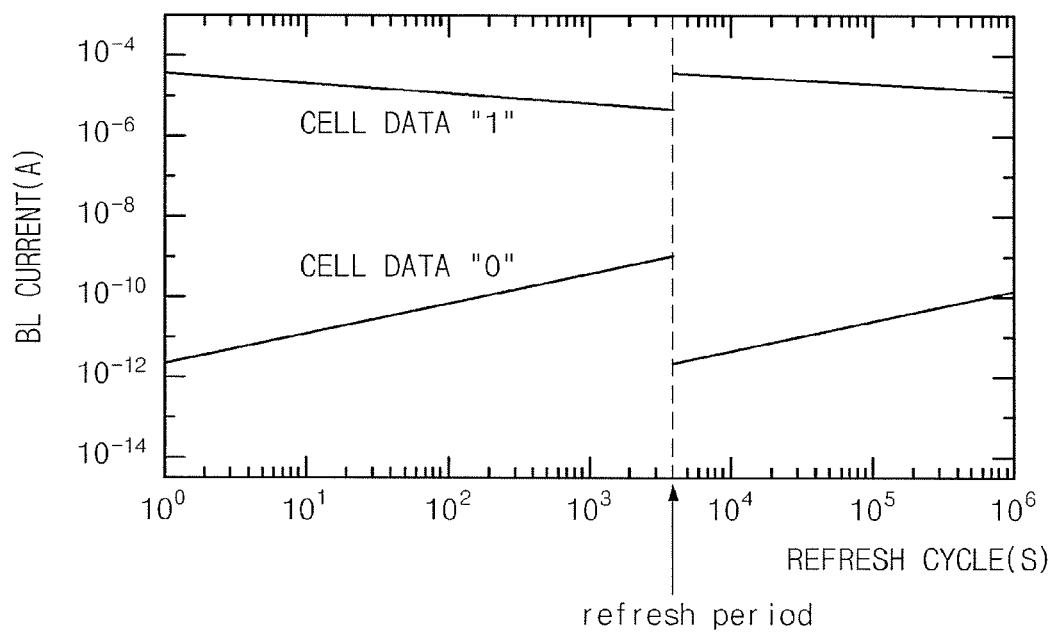
FIG. 49 is a graph showing a data retention characteristic of the semiconductor memory device shown in FIG. 40.

FIG. 49 is a graph illustrating a data retention characteristic of the semiconductor memory device shown in FIG. 40.

Although the 1T-FET type memory cell of the conventional memory device has a nonvolatile characteristic, cell data degrades as time passes thereby limiting data retention. As a result, the bit line BL current corresponding to the logic cell data "1" and "0" is reduced as time passes by.

However, when the refresh operation is performed with a given cycle with a given timing when bit line BL current is reduced, thereby restoring cell data to improve data retention characteristics.

When the data retention characteristics of the memory cell are reduced to a pre-set target value, a refresh circuit is driven to restore the cell data to the initial state. The degradation limit target time of the cell becomes a refresh time such that all cells operate within the refresh time.

The above-described memory device has nonvolatile characteristics, and retains stored data even when a power source is no longer supplied to the memory device, thereby overcoming problems associated with the conventional DRAM. The on/off time of the power source is summed and set as the whole data retention time such that the refresh operation is not frequently performed, thereby reducing power consumption and improving operational performance.

As described above, a semiconductor memory device is according to an embodiment of the present invention writes data in a plurality of cells without increasing a write current thereby reducing a write time in a memory device using a phase change resistor.

The semiconductor memory device writes data in a plurality of cells without increasing the write current thereby reducing the write time in a memory device using a MTJ cell.

The semiconductor memory device writes data in a plurality of cells without increasing a write current thereby reducing a write time in a memory device using a RSD.

The semiconductor memory device improves the cell structure by applying a phase change resistor (PCR) to the DRAM thereby reducing the cell size.

The semiconductor memory device embodies a semiconductor memory device including a switching element and a phase change resistor for performing a refresh operation to improve a data retention characteristic.

The semiconductor memory device maintains the data of the phase change memory device when power is not supplied and simultaneously performs a refresh operation with a specific cycle thereby restoring degraded cell data and improving data retention characteristics.

The semiconductor memory device performs a refresh operation according to parameter information stored in the nonvolatile register when a power is off such that refresh information is maintained even when the power is off.

The semiconductor memory device sets the whole data retention time including on/off periods of the power, to reduce the frequency of the performed refresh operations, thereby reducing power consumption and improving operating performance.

The semiconductor memory device controls the refresh operation according to a system timer when power is off in order to maintain memory data of the refresh period effectively regardless of on/off state of the power.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings, and the accompanying claims. In addition to variations and modifications in the component parts and/or arrangements, alternative uses will also be apparent to those skilled in the art.

What is claimed is:

1. A semiconductor memory device comprising:
a cell array comprising a phase change resistance cell configured to read and write data;
a sense amplifier configured to sense and amplify data stored in the cell array;
a register configured to store information of the sense amplifier; and
a refresh control means configured to perform a refresh operation with a specific refresh cycle using the information stored in the register according to a refresh control signal, and to improve a retention characteristic of data stored in the cell array,
wherein the refresh control means comprises a refresh register configured to store nonvolatile parameter information for controlling the refresh operation and to output the refresh control signal in the refresh operation,
wherein the cell array comprises
a word line;
a plurality of bit lines;
a read/write bit line configured to supply a cell driving voltage;
a selecting unit connected to the read/write bit line and controlled by the word line;
a plurality of phase change resistance cells connected serially between the selecting unit and a source line and configured to read/write data according to the cell driving voltage; and
a plurality of switching elements each connected in parallel to a corresponding one of the phase change resistance cells and controlled selectively by a corresponding one of the bit lines.

2. The semiconductor memory device according to claim 1, wherein the phase change resistance cell includes:
a phase change resistor configured to sense a change in crystallization state and to store data corresponding to a corresponding resistance change,
wherein the crystallization state is changed according to currents applied to the phase change resistor through a bit line; and
a switching element connected between the phase change resistor and a source line and controlled by a word line.

3. The semiconductor memory device according to claim 1, wherein the phase change resistance cell comprises:
a phase change resistor configured to sense a change in crystallization state and to store data corresponding to a corresponding resistance change,
wherein the crystallization state is changed according to currents applied to the phase change resistor through a bit line; and
a diode element connected between the phase change resistor and the word line.

4. The semiconductor memory device according to claim 1, wherein the refresh control means comprises:
a refresh control unit configured to control the refresh operation in response to the refresh control signal and to output a count address for the refresh operation;

a row address controller configured to output the signal and row address to the cell array by latching and decoding a row address inputted in response to a Row Address Strobe (RAS) signal and an output signal of the refresh control unit, and to output the count address to the cell array by selecting the count address in the refresh operation;

a column address controller configured to latch and decode a column address inputted in response to a Column Address Strobe (CAS) signal; and an input/output logic unit configured to control read/write operations of the cell array in response to an output enable signal and read/write commands.

5. The semiconductor memory device according to claim 4, wherein the refresh control unit comprises:

a refresh controller configured to output a refresh signal and a refresh enable signal for performing the refresh operation in response to the refresh control signal; and a refresh counter configured to count a refresh cycle in response to the refresh signal so as to output the count address.

6. The semiconductor memory device according to claim 1, wherein the cell array further comprises:

a write driving unit configured to supply a driving voltage corresponding to write data to the cell array.

7. The semiconductor memory device according to claim 1, wherein the cell array further comprises:

a global write driving unit configured to supply the cell driving voltage to the read/write bit line; and a source driving unit configured to supply a ground voltage or a write voltage to the source line.

8. A refresh method of a semiconductor memory device, the method comprising the steps of:

reading and writing data in a cell array, the cell array comprising a phase change resistor configured to store data corresponding to resistance change, wherein the resistance change corresponds to a change in crystallization state of the phase change resistor that depends on currents applied to the phase change resistor through a bit line;

sensing and amplifying data read in the cell array;

storing the data in a register;

storing a nonvolatile parameter information for controlling a refresh operation and outputting a refresh control signal in the refresh operation; and refreshing data of the cell array with a specific predetermined refresh cycle according to a refresh control signal so as to improve retention characteristics of data stored in the cell array, wherein the cell array comprises a word line;

a plurality of bit lines;

a read/write bit line configured to supply a cell driving voltage;

a selecting unit connected to the read/write bit line and controlled by the word line;

a plurality of phase change resistance cells connected serially between the selecting unit and a source line and configured to read/write data according to the cell driving voltage; and a plurality of switching elements each connected in parallel to a corresponding one of the phase change resistance cells and controlled selectively by a corresponding one of the bit lines.

9. The refresh method according to claim 8, wherein the step of refreshing data of the cell array comprises the steps of:

reading refresh count information previously stored with a nonvolatile phase and power off time information;

sensing a power on state;

determining whether a refresh time is exceeded in a refresh operation; and restoring the data stored in the register in the cell array.

10. The refresh method according to claim 9, wherein the step of determining whether the refresh time is exceeded further comprises uploading memory data to perform a refresh operation when the refresh time is exceeded, and performing the previous refresh operation when the refresh time is not exceeded.

* * * * *